United States Patent
Yoshida et al.

(10) Patent No.: US 11,581,706 B2
(45) Date of Patent: *Feb. 14, 2023

(54) WAVELENGTH-VARIABLE LASER

(71) Applicant: FURUKAWA ELECTRIC CO., LTD., Tokyo (JP)

(72) Inventors: Junji Yoshida, Tokyo (JP); Hirokazu Itoh, Tokyo (JP); Satoshi Irino, Tokyo (JP); Yuichiro Irie, Tokyo (JP); Taketsugu Sawamura, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 73 days.

This patent is subject to a terminal disclaimer.

(21) Appl. No.: 17/186,933

(22) Filed: Feb. 26, 2021

(65) Prior Publication Data

US 2021/0184436 A1 Jun. 17, 2021

Related U.S. Application Data

(63) Continuation of application No. 16/672,163, filed on Nov. 1, 2019, now Pat. No. 10,938,183, which is a (Continued)

(51) Int. Cl.
*H01S 5/00* (2006.01)
*H01S 5/32* (2006.01)
(Continued)

(52) U.S. Cl.
CPC ............ *H01S 5/3216* (2013.01); *B82Y 20/00* (2013.01); *H01S 3/0675* (2013.01); (Continued)

(58) Field of Classification Search
CPC .... H01S 5/2018; H01S 5/2077; H01S 5/2205; H01S 5/2206; H01S 5/024; H01S 3/0674; H01S 3/04
See application file for complete search history.

(56) References Cited

U.S. PATENT DOCUMENTS 6,396,861 B1 * 5/2002 Shimizu ............... H01S 5/34
372/45.01
6,987,285 B2 1/2006 Nagashima et al.
(Continued)

FOREIGN PATENT DOCUMENTS

JP 05-243669 A 9/1993
JP 2000-174394 A 6/2000
(Continued)

OTHER PUBLICATIONS

International Search Report dated Jun. 25, 2013 for PCT/JP2013/0060391 filed on Apr. 4, 2013 with English Translation.
(Continued)

*Primary Examiner* — Kinam Park
(74) *Attorney, Agent, or Firm* — Oblon, McClelland, Maier & Neustadt, L.L.P.

(57) ABSTRACT

An optical semiconductor device outputting a predetermined wavelength of laser light includes a quantum well active layer positioned between a p-type cladding layer and an n-type cladding layer in thickness direction. The optical semiconductor device includes a separate confinement heterostructure layer positioned between the quantum well active layer and the n-type cladding layer. The optical semiconductor device further includes an electric-field-distribution-control layer positioned between the separate confinement heterostructure layer and the n-type cladding layer and configured by at least two semiconductor layers having band gap energy greater than band gap energy of a barrier layer constituting the quantum well active layer. The quantum well active layer is doped with 0.3 to $1 \times 10^{18}/cm^3$ of n-type impurity.

12 Claims, 13 Drawing Sheets

Related U.S. Application Data continuation-in-part of application No. 16/029,285, filed on Jul. 6, 2018, now Pat. No. 10,511,150, which is a continuation-in-part of application No. 15/454,444, filed on Mar. 9, 2017, now Pat. No. 10,020,638, which is a continuation of application No. 14/795,387, filed on Jul. 9, 2015, now Pat. No. 9,601,905, which is a continuation of application No. 14/507,374, filed on Oct. 6, 2014, now Pat. No. 9,083,150, which is a continuation of application No. PCT/JP2013/060391, filed on Apr. 4, 2013.

(60) Provisional application No. 61/621,013, filed on Apr. 6, 2012.

(51) Int. Cl.

| | | |
|---|---|---|
| *H01S 3/067* | (2006.01) | |
| *H01S 5/34* | (2006.01) | |
| *H01S 5/22* | (2006.01) | |
| *H01S 5/20* | (2006.01) | |
| *H01S 5/343* | (2006.01) | |
| *H01S 5/227* | (2006.01) | |
| *B82Y 20/00* | (2011.01) | |
| *H01S 5/10* | (2021.01) | |
| *H01S 5/02251* | (2021.01) | |
| *H01S 5/02253* | (2021.01) | |
| *H01S 3/094* | (2006.01) | |
| *H01S 5/024* | (2006.01) | |
| *H01S 3/04* | (2006.01) | |
| *H01S 5/14* | (2006.01) | |
| *H01S 5/028* | (2006.01) | |
| *H01S 3/30* | (2006.01) | |
| *H01S 3/0941* | (2006.01) | |

(52) U.S. Cl.
CPC ...... *H01S 3/06754* (2013.01); *H01S 5/02251* (2021.01); *H01S 5/02253* (2021.01); *H01S 5/1064* (2013.01); *H01S 5/2018* (2013.01); *H01S 5/2077* (2013.01); *H01S 5/2205* (2013.01); *H01S 5/2206* (2013.01); *H01S 5/227* (2013.01); *H01S 5/3213* (2013.01); *H01S 5/34* (2013.01); *H01S 5/3406* (2013.01); *H01S 5/3434* (2013.01); *H01S 5/34306* (2013.01); *H01S 3/04* (2013.01); *H01S 3/09415* (2013.01); *H01S 3/094003* (2013.01); *H01S 3/094011* (2013.01); *H01S 3/302* (2013.01); *H01S 5/0064* (2013.01); *H01S 5/024* (2013.01); *H01S 5/0287* (2013.01); *H01S 5/1039* (2013.01); *H01S 5/146* (2013.01); *H01S 5/2222* (2013.01); *H01S 2301/03* (2013.01); *H01S 2301/166* (2013.01)

(56) References Cited

U.S. PATENT DOCUMENTS

| | | | |
|---|---|---|---|
| 7,483,470 B2 | 1/2009 | Nagashima et al. | |
| 9,083,150 B2 | 7/2015 | Yoshida | |
| 9,601,905 B2* | 3/2017 | Yoshida | H01S 5/3434 |
| 10,020,638 B2* | 7/2018 | Yoshida | H01S 5/02253 |
| 10,511,150 B2 | 12/2019 | Yoshida et al. | |
| 2004/0089866 A1* | 5/2004 | Nagashima | B82Y 20/00 |
| | | | 257/79 |
| 2006/0133440 A1* | 6/2006 | Kim | B82Y 20/00 |
| | | | 372/45.01 |
| 2006/0285560 A1* | 12/2006 | Nagashima | H01S 5/227 |
| | | | 372/19 |

FOREIGN PATENT DOCUMENTS

| | | |
|---|---|---|
| JP | 03-525257 B1 | 2/2004 |
| JP | 2004-153212 A | 5/2004 |
| JP | 2005-072402 A | 3/2005 |
| JP | 2005-191349 A | 7/2005 |
| JP | 2007-220692 A | 8/2007 |
| JP | 2013-120893 A | 6/2013 |
| WO | WO 2005/088791 A1 | 9/2005 |

OTHER PUBLICATIONS

International Written Opinion dated Jun. 25, 2013 for PCT/JP2013/0060391 filed on Apr. 4, 2013.
Jan P. Van Der Ziel, et al., "InGaAsP($\lambda$=1.3 µm) Stripe Buried Heterostructure Lasers Grown by MOCVD," IEEE Journal of Quantum Electronics vol. 27, No. 11, pp. 2378-2385, Nov. 1991.

* cited by examiner

WAVELENGTH-VARIABLE LASER

CROSS-REFERENCE TO RELATED APPLICATION(S)

This application is a continuation of U.S. patent application Ser. No. 16/672,163, filed Nov. 1, 2019, which is a continuation-in-part of U.S. patent application Ser. No. 16/029,285, filed Jul. 6, 2018, now U.S. Pat. No. 10,511,150, which is a continuation-in-part of U.S. patent application Ser. No. 15/454,444, filed Mar. 9, 2017, now U.S. Pat. No. 10,020,638, which is a continuation of U.S. patent application Ser. No. 14/795,387, filed Jul. 9, 2015, now U.S. Pat. No. 9,601,905, which is a continuation of U.S. patent application Ser. No. 14/507,374, filed Oct. 6, 2014, now U.S. Pat. No. 9,083,150, which is a continuation of International Application No. PCT/JP2013/060391 filed on Apr. 4, 2013, which claims the benefit of priority from U.S. Provisional Patent Application No. 61/621,013 filed on Apr. 6, 2012, the entire contents of all of which are incorporated herein by reference.

BACKGROUND OF THE INVENTION

1. Field of the Invention

The present invention relates to a wavelength-variable laser, a semiconductor laser module, and an optical fiber amplifier.

2. Description of the Related Art

In recent years, increase in data traffic due to rapid spread of Internet or rapid increase in connections among intra-company LANs, etc. is a problem. Then, in order to solve that problem, a wavelength division multiplexing (WDM) system has achieved a remarkable development and become popular. In the WDM system, by multiplexing a plurality of signals onto lights each having different wavelength, large capacity transmission which is equal to or greater than 100 times relative to conventional cases is realized by using an optical fiber. In particular, in the WDM system, optical amplification by an optical fiber amplifier such as an erbium-doped optical fiber amplifier (hereinafter, EDFA) or a Raman amplifier etc. is indispensable, this optical amplification enables wide-band and long-haul transmission. Herein an EDFA is an optical fiber amplifier to which the principles applied that, when inputting pumping light having a wavelength of 1480 nm or a wavelength of 980 nm etc. from a pumping laser into a special optical fiber (hereinafter EDF) which is doped with erbium which is rare earth, 1550 nm band wavelength of light which is simultaneously-inputted transmission signal light is amplified in the above-described EDF.

Also, as a form of using EDFA, a so-called remote-pump-type is proposed, in which, when amplifying signal light in the middle of a transmission optical fiber laid on seabed, a pumping laser is disposed on land and pumping light outputted from the pumping laser is made input into the EDF through the transmission optical fiber. In the remote-pump-type EDFA, the pumping laser can be maintained or replaced easily by disposing the pumping laser on land.

On the other hand, a Raman amplifier is an optical fiber amplifier of a distributed type which, unlike an EDFA, does not need a special optical fiber such as an erbium-doped optical fiber but uses an optical fiber of an ordinary transmission path as a gain medium. Since the Raman amplifier has flat gain in wide-band, as compared with a WDM transmission system based on a conventional EDFA, the Raman amplifier has a feature capable of realizing wide-band transmission band. It should be noted that, in the Raman amplifier, since its amplification gain is lower than that of the EDFA, its pumping laser is required to have high output characteristics equal to or greater than that of the EDFA.

Therefore, in order to realize improvement in stability of the WDM system or reduction of the number of repeating, the pumping laser is required to have stable and high optical output capability. As the pumping laser, semiconductor laser devices having various structures such as a buried hetero (BH) structure etc. are used, and currently, for the above-described reason, development for especially a high power output semiconductor laser device is ongoing actively (see Jan P. van der Ziel, et. al., "InGaAsP ($\lambda$=1.3 µm) Stripe Buried Heterostructure Lasers Grown by MOCVD," IEEE JOURNAL OF QUANTUM ELECTRONICS VOL. 27, NO. 11, pp. 2378-2385, 1991, Japanese Patent Application Laid-open No. 2000-174394, and Japanese Patent No. 3525257, which are referred as a Non-Patent document 1, Patent document 1 and Patent document 2, respectively).

SUMMARY OF THE INVENTION

It is an object of the present invention to at least partially solve the problems in the conventional technology.

In accordance with one aspect of the present invention, a wavelength-variable laser outputting a predetermined wavelength of laser light includes: a quantum well active layer positioned between a p-type cladding layer and an n-type cladding layer in thickness direction; a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer.

In accordance with another aspect of the present invention, a semiconductor laser module includes: a wavelength-variable laser which is a semiconductor laser element outputting a predetermined wavelength of laser light which includes: a quantum well active layer positioned between a p-type cladding layer and an n-type cladding layer in thickness direction; a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer. The semiconductor laser module includes: a temperature-control module controlling temperature of the semiconductor laser element; an optical fiber guiding the laser light outputted from the semiconductor laser element to outside; and an optical-coupling lens system coupling the semiconductor laser element and the optical fiber optically.

In accordance with still another aspect of the present invention, an optical fiber amplifier includes: a semiconductor laser module which includes a wavelength-variable laser which is a semiconductor laser element outputting a predetermined wavelength of laser light which includes: a quantum well active layer positioned between a p-type cladding layer and an n-type cladding layer in thickness direction; a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer. The semiconductor laser module includes: a temperature-control module controlling temperature of the semiconductor laser element; an optical fiber guiding the laser light outputted from the semiconductor laser element to outside; and an optical-coupling lens system coupling the semiconductor laser element and the optical fiber optically. The optical fiber amplifier includes: an amplification optical fiber including amplification medium; and an optical coupler multiplexing inputted signal light and the laser light outputted from the semiconductor laser module and making the multiplexed light input into the amplification optical fiber.

In accordance with still another aspect of the present invention, an optical fiber amplifier includes: a semiconductor laser module which includes a wavelength-variable laser which is a semiconductor laser element outputting a predetermined wavelength of laser light which includes: a quantum well active layer positioned between a p-type cladding layer and an n-type cladding layer in thickness direction; a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer. The semiconductor laser module includes: a temperature-control module controlling temperature of the semiconductor laser element; an optical fiber guiding the laser light outputted from the semiconductor laser element to outside; and an optical-coupling lens system coupling the semiconductor laser element and the optical fiber optically. The optical fiber amplifier includes: an optical fiber transmitting signal light; and an optical coupler making the laser light outputted from the semiconductor laser module input into the optical fiber. In the optical fiber amplifier, an optical amplification is performed by Raman amplification.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
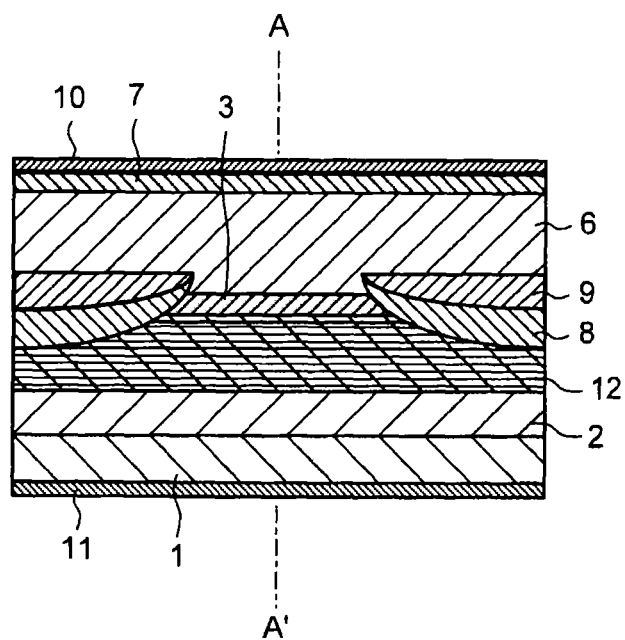
FIG. 1 is a cross section, which is in parallel with an outputting surface, of a semiconductor laser element according to an embodiment 1.

Hereinafter, embodiments of a wavelength-variable laser, a semiconductor laser module, and an optical fiber amplifier according to the present invention will be explained in detail with reference to the drawings. It should be noted that the present invention is not limited by these embodiments. Also, in each drawing, if deemed appropriate, identical or equivalent elements are given same reference numerals. In addition, it should be noted that the drawings are schematic depictions, and may not represent the actual relation of dimension of each element. Furthermore, different drawings may include portions using different scales and dimensional relations.

The following problem occurs along with improvement of enhancing power output of semiconductor laser device constituting a pumping laser. That is, along with increase in driving current and driving voltage along with improvement of enhancing power output of a pumping light source, increase in power consumption of a pumping light source occurs. This raises a concern that power consumption increases in not only in optical communication systems but also in air-conditioning systems for cooling the systems. Large-capacity and ultra-high-speed communication systems are required to reduce power consumption.

In general, there are mainly the following methods of reducing power consumption of a semiconductor laser element.

1) a method of reducing electric resistance and thermal resistance by extending an active layer width while maintaining a single transverse mode 2) a method of, by introducing an asymmetric electric field distribution structure in which an optical electric field distribution is distributed at an n-type cladding layer side, reducing the electric field distributed at a p-type cladding layer side, intending higher efficiency of external differential quantum efficiency of an element by reducing internal loss along with reduction in inter valence band absorption, and reducing power consumption by reducing driving current and driving voltage.

Respective arts are disclosed by the Non-Patent document 1 regarding the above described 1), the Patent document 1 regarding the above described 2), and the Patent document 1 regarding a combination of the above described 1) and 2).

However, these publicly known arts have the following problems.

(Non-Patent Document 1)

It discloses that a waveguide layer is disposed under a GaInAsP active layer, the center of an optical electric field distribution is shifted to a substrate side, and it is operable with a single transverse mode even at 5 µm width of the active layer. However, it is a problem that threshold current increases with the increasing thickness of the waveguide layer and characteristic temperature of the threshold current decreases. This raises a problem that increase in threshold carrier density, increase in non-radiative component due to Auger effect at high temperature, and leakage current to the waveguide layer cause the threshold current to increase. Also, there is a problem that, since quantum efficiency does not depend on the thickness of the waveguide layer, loss in the waveguide layer limits the external differential quantum efficiency.

(Patent Document 1)

As a method of solving a problem of optical loss due to inter valence band absorption, an art of disposing an optical-field-controlling layer, of which refractive index is higher than that of its n-type cladding layer and closer to refractive index of an active layer, inside the n-type cladding layer, shifting the distribution of light to the n-type cladding layer side, and reducing the amount of light distributed in the p-type cladding layer.

However, the structure of the optical-field-controlling layer is the same as that of the active layer.

As a result, there is a problem that, when being disposed at a position far from a separate confinement heterostructure (SCH) layer, another optical waveguide is formed and the distribution of light becomes dual-peak.

Therefore, although this optical-field-controlling layer must be disposed in the vicinity of a lower-portion SCH layer, if an optical-field-controlling layer of which refractive index is high like this is disposed in the vicinity of the lower-portion SCH layer, there is a problem that, equivalent refractive index of the entire waveguide becomes high, operation with a single transverse mode becomes difficult, and a high-order transverse mode occurs.

Also, this high-order transverse mode can be prevented by narrowing the width of a region including the active layer and the SCH layer. However, if the width of the region including the active layer and the SCH layer is narrowed in this manner, since electric resistance and thermal resistance of an element cannot be reduced, there is a problem that optical output saturation occurs due to heat generated at the active layer when being highly injected.

(Patent Document 2)

It is an object to provide a semiconductor light-emitting element which can obtain high power output with a simple configuration and mode transfer hardly occurs even if optical confinement coefficient for an active layer is lowered. A semiconductor light-emitting element for this purpose is characterized in that a multi quantum well active layer sandwiched between an n-type cladding layer and a p-type cladding layer made from InP is provided on an InP substrate, and that the n-type cladding layer is made from InGaAsP.

Therefore, it is configured that increase, in light loss due to inter valence band light absorption in the p-type cladding layer, caused by lowering optical confinement coefficients in the active layer and an SCH layer can be restrained, and high power output laser light can be obtained.

Also, since refractive index difference between the active layer and the n-type cladding layer becomes smaller than that of a conventional art, the maximum active layer width that can restrain high-order transverse mode can be extended; and therefore, it is advantageous to enable the semiconductor laser element to output higher power.

However, the n-type cladding layer is set at a thickness of approximately 7.5 µm. It is usually difficult to form that thick n-type cladding layer by matching lattice constant of InGaAsP with that of InP while restraining crystal defects. In particular, in case of 0.95 µm of composition wavelength, there is a problem that ratios of Ga and As become minute with respect to In or P; thus, difficulty in composition control increases further. In addition, there is a problem that laminating the n-type cladding layer takes approximately three hours; thus manufacturing time takes too long. Also, it is a problem that a part of sediment which adheres to an inner wall of the reactor for MOCVD then adheres to a surface of the growth substrate as particle and causes epitaxial surface defects. As a result, the number of qualitatively-acceptable elements obtained from a wafer reduces; thus, it is a problem for cost reduction.

In contrast to this, embodiments shown as follows are effective to at least one of the above described problems.

A semiconductor laser element according to an embodiment 1 of the present invention will be explained. The semiconductor laser element according to the present embodiment 1 is a high power-output semiconductor laser element having buried hetero structure and being used as a pumping laser, and includes an electric-field-distribution-control layer between an SCH layer and an n-InP cladding layer positioned under a quantum well active layer. As compared with a structure having no electric-field-distribution-control layer, this enables higher power output operation by reducing optical electric field distribution to the p-InP cladding layer, reducing inter valence band absorption, and increasing external differential quantum efficiency.

The electric-field-distribution-control layer, configured by a semiconductor layer having band gap energy greater than band gap energy of a barrier layer constituting the quantum well active layer, restrains absorption of laser light emitted from the quantum well active layer and enables high power output operation.

It is preferable that the electric-field-distribution-control layer is configured with composition having band gap energy between band gap energy of the n-InP cladding layer and band gap energy of the barrier layer. This becomes a structure in which injected carrier is difficult to be trapped by the electric-field-distribution-control layer and lowering of efficiency in injecting carrier into the quantum well active layer is restrained. As a result, increase in threshold current, lowering of efficiency, and increase in resistance due to introduction of the electric-field-distribution-control layer can be restrained.

Also, in case where the semiconductor laser element is of the BH structure, by introducing the electric-field-distribution-control layer under a current-blocking layer which constitutes the current-confining structure and making the current-confining structure and the electric-field-distribution-control layer overlap in the in thickness direction, equivalent refractive index difference between the active layer region and the current-blocking region (current-confining region) can be reduced.

As a result, it is possible to extend the active layer width while maintaining the single transverse mode. By doing this way, since electric resistance and thermal resistance can be reduced, a high-power-outputting and low power-consuming laser device, in which thermal saturation is restrained, can be realized.

In particular, by configuring the electric-field-distribution-control layer with the InP layer as a first semiconductor layer which is semiconductor material having band gap energy identical with that of the n-type cladding layer and a GaInAsP layer as a second semiconductor layer made from semiconductor material of which band gap energy is greater than that of the barrier layer constituting the quantum well active layer, the above described equivalent refractive index difference can be reduced than in a case of configuring the electric-field-distribution-control layer only with the GaInAsP layer. By doing this, a single transverse mode laser device having wider active width can be realized, and a high power-outputting and low power consuming laser device in which thermal saturation hardly occurs can be realized.

Also, by reducing the sum of the layer thicknesses of the GaInAsP layers as the second semiconductor layer constituting the electric-field-distribution-control layer to be lower than 1 µm, an electric-field-distribution-control layer having fewer crystal defects can be realized. Also, in order to obtain sufficient effect as the electric-field-distribution-control layer, it is preferable to set the sum of the layer thicknesses of the GaInAsP layers to be equal to or greater than 100 nm.

Also, by setting band gap composition wavelength of the GaInAsP layer as the second semiconductor layer constituting the electric-field-distribution-control layer to be equal to or greater than 1 µm, since it is possible to control Ga composition and As composition easily, lowering of manufacturing yield can be restrained. Furthermore, since it is possible to set the thickness of the electric-field-distribution-control layer at approximately 3 µm, it can be grown in a shorter period, i.e., approximately 40% of period for growing 7.5 µm-thickness of an n-GaInAsP-cladding layer as disclosed by Patent Document 2. By doing this way, it is possible to realize a laser device which is suitable for mass-production at lower cost.

Figure 2:
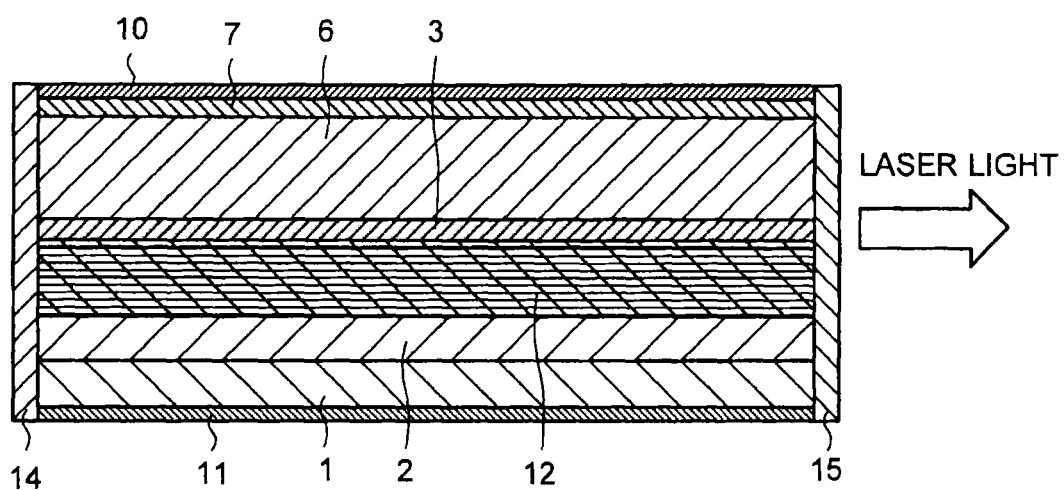
FIG. 2 is a cross section, which is in the longitudinal direction of the semiconductor laser element according to the embodiment 1.

FIG. 1 is a cross section, which is in parallel with a output surface, of a semiconductor laser element according to an embodiment 1. FIG. 2 is a cross section in the longitudinal direction cut along a line A-A' of FIG. 1. The semiconductor laser element shown in FIGS. 1 and 2 is a Fabry-Perot type laser to which a so-called buried hetero structure is applied as a current-confining structure.

That is, the n-InP cladding layer 2, an electric-field-distribution-control layer 12, and a graded index-separate confinement heterostructure multi quantum well (GRIN-SCH-MQW) active layer 3 are layered in this order on an n-InP substrate 1.

The electric-field-distribution-control layer 12 in an upper portion of the n-InP cladding layer 2 and the GRIN-SCH-MQW active layer 3 form a mesa-stripe-like structure of which longitudinal direction is along a light-outputting direction. A p-InP current block layer 8 and an n-InP current block layer 9 as the current-confining structure are layered in this order adjacent to two sides with respect to a width direction of this mesa-stripe structure. A p-InP cladding layer 6 and a p-GaInAsP contact layer 7 are layered on the n-InP current block layer 9. Also, a p-side electrode 10 is formed on the p-GaInAsP contact layer 7 and an n-side electrode 11 is formed on a back surface of the n-InP substrate 1. Furthermore, as shown in FIG. 2, a output-side reflecting coating 15 is formed on a laser-light-output facet from which laser light is outputted, and a reflection-side reflecting coating 14 is formed on a reflecting facet facing the radiation-side reflecting coating 15.

Function of each layer described above will be explained briefly as follows. Firstly, since the n-InP cladding layer 2 has refractive index lower than effective refractive index of the GRIN-SCH-MQW active layer 3, the n-InP cladding layer 2 has a function of confining light generated from the GRIN-SCH-MQW active layer 3 in a vertical (thickness) direction.

The p-InP current block layer 8 and the n-InP current block layer 9 carry out a function of confining current injected from the p-side electrode 10, confining light generated from the GRIN-SCH-MQW active layer 3 in a transverse (width) direction, and realizing a single transverse mode operation in which a high order of lateral transverse mode is restrained. Since the p-side electrode 10 serves as an anode in the semiconductor laser element according to the present embodiment 1, in case where voltage is applied between the p-side electrode 10 and the n-side electrode 11, reverse-bias is applied between the n-InP current block layer 9 and the p-InP current block layer 8. Therefore, current does not flow from the n-InP current block layer 9 toward the p-InP current block layer 8, and current injected from the p-side electrode 10 is confined and flows into the GRIN-SCH-MQW active layer 3.

The reflection-side reflecting coating 14 and the output-side reflecting coating 15 are mirrors for forming a cavity, and their optical reflectivity are optimized according to cavity length. Herein it should be noted that reflectivity of the reflection-side reflecting coating 14 is set at 95% and reflectivity of the output-side reflecting coating is set at 1.5%. It should be noted that, although reflectivity of the reflection-side reflecting coating 14 is set at 95% for laser light, the laser light outputted from this facet is used as monitor light for stabilizing output when operating the semiconductor laser module using this semiconductor laser element. Therefore, although reflectivity of the reflection-side reflecting coating 14 is determined according to a system to which the semiconductor laser element is applied, characteristics as the high power output laser device is not influenced if the reflectivity is equal to or greater than 90%.

In addition, in order to obtain higher power output, it is desirable that cavity length L is equal to or greater than 800 μm, and for example, it may be 1000 μm or 1300 μm.

The cavity length of the semiconductor laser element according to the present embodiment 1 is set at L=2000 μm.

The structure formed by each above-described layer is similar to a conventional buried hetero structure and can be replaced by known material, which is other than the above-described material or conductive type, formed with the similar structure. The present embodiment 1 is characterized in that the above-described electric-field-distribution-control layer 12 is provided in an upper portion of the n-InP cladding layer 2 in such a buried hetero structure.

Hereinafter, function and effect of the electric-field-distribution-control layer 12 will be explained.

The electric-field-distribution-control layer 12 is disposed between a lower side SCH layer constituting the GRIN-SCH-MQW active layer 3 and the n-InP cladding layer 2 and is formed with material having band gap energy greater than energy of light according to oscillation wavelength.

As compared with a structure having no electric-field-distribution-control layer 12, the electric-field-distribution-control layer 12 reduces optical electric field distribution in the p-InP cladding layer 6, reduces inter valence band absorption, increases external differential quantum efficiency, and enables high power output operation.

Herein, by configuring the electric-field-distribution-control layer 12 with a semiconductor layer having band gap energy which is greater than band gap energy of the barrier layer constituting the GRIN-SCH-MQW active layer 3, it is possible to restrain absorption of laser light emitted from the active layer and enable high power output operation.

Furthermore, the electric-field-distribution-control layer 12 has composition of which band gap energy is between those of the n-InP cladding layer and the barrier layer. By doing this way, a structure is obtained in which injected carrier is hardly trapped in the electric-field-distribution-control layer 12 and reduction in efficiency for injecting carrier into the GRIN-SCH-MQW active layer 3 is restrained. By doing this way, increase in threshold current, reduction in efficiency, and increase in resistance due to introduction of the electric-field-distribution-control layer 12 can be restrained.

Also, since equivalent refractive index difference between the active layer region and the current-blocking region can be reduced by introducing the electric-field-distribution-control layer 12 in a lower layer of the p-InP current block layer 8 and the n-InP current block layer 9 and making the p-InP current block layer 8 and the n-InP current block layer 9 overlap with the electric-field-distribution-control layer 12 in the thickness direction, it is possible to extend the active layer width while maintaining the single transverse mode. By doing this way, since it is possible to reduce electric resistance and thermal resistance, a low-power-consuming and high-power-outputting laser device of which thermal saturation is restrained can be realized.

In particular, by forming the electric-field-distribution-control layer 12 with the InP layer as the first semiconductor layer which is semiconductor material having band gap energy identical with that of the n-InP cladding layer 2 and the GaInAsP layer as the second semiconductor layer which is made of semiconductor material of which band gap energy is greater than that of the barrier layer constituting the GRIN-SCH-MQW active layer 3, the above described equivalent refractive index difference can be lower than a case where the electric-field-distribution-control layer 12 is formed only with the GaInAsP layer. By doing this way, a single transverse mode laser device having wider active width can be realized and a low-power-consuming and high-power-outputting laser device in which thermal saturation hardly occurs can be realized.

Also, by reducing the sum of the layer thicknesses of the GaInAsP layers as the second semiconductor layer constituting the electric-field-distribution-control layer 12 to 1 μm, the electric-field-distribution-control layer 12 having less crystal defects can be realized.

In particular, since it is possible to control Ga composition and As composition easily by setting the band gap composition wavelength of the GaInAsP layer as the second semiconductor layer constituting the electric-field-distribution-control layer 12 at equal to or greater than 1 μm, it is possible to restrain lowering of the manufacturing yield. Furthermore, since it is possible to set the thickness of the electric-field-distribution-control layer 12 at approximately 3 μm, and therefore, since it can be grown in a shorter period, i.e., approximately 40% of period for growing 7.5 μm-thickness of an n-GaInAsP-cladding layer as disclosed by Patent Document 2, a low-cost laser device which is suitable for mass-production can be realized.

An example of a process manufacturing a semiconductor laser element according to the embodiment 1 shown in FIG. 1 will be explained as follows.

To start with, the n-InP cladding layer 2 which is made of InP having 0.5 μm of thickness and 1 to $2\times10^{18}/cm^3$ of density of impurity is formed on the n-type InP semiconductor substrate 1 by using metal-organic chemical vapor deposition (MOCVD) method.

After that, the electric-field-distribution-control layer 12 configured to have 2.6 μm of thickness is formed.

The electric-field-distribution-control layer 12 in this state is configured with 4 cycles of a GaInAsP layer having 0.95 μm of composing wavelength and 20 nm of thickness, an InP layer having 180 nm of thickness, a GaInAsP layer having 1.0 μm of composing wavelength and 40 nm of thickness, and an InP layer having 160 nm of thickness, and with 4 cycles of a GaInAsP layer having 1.1 μm of composing wavelength and 16 nm of thickness and an InP layer having 384 nm of thickness. That is, it is a structure in which the total thickness of the GaInAsP layer included in the electric-field-distribution-control layer 12 is 244 nm and accounts for 9.4% of the total thickness (2600 nm) of the electric-field-distribution-control layer 12. Also, in the present embodiment 1, the electric-field-distribution-control layer 12 is doped with $1\times10^{18}/cm^3$ of density of impurity to be an n-type electric-field-distribution-control layer.

Herein it is desirable that the sum of the layer thicknesses of the n-InP cladding layers are approximately 0.5 μm to 3.5 μm. A lower limit value is determined from a view point for a buffer layer for restraining dislocation from a substrate, and an upper limit value is determined from a view point for load to a crystal-growing equipment caused by longer crystal-growing time and manufacturing cost.

In case of configuring the first semiconductor layer with InP as a material, it is preferable that each layer thickness of the first semiconductor layer is 10 to 50 nm.

When the layer thickness is thinner than 10 nm, quantum size effect becomes noticeable. In addition, mutual diffusion of group V atoms occurs at an interface of the first semiconductor layer and the second semiconductor layer by heat applied in a regrowth process for forming a BH structure or in thermal treatment process at a process of forming electrodes. Although this forms a quantum status in which an electron transits at a wavelength shorter than designed, when the layer thickness is thinner, effect by shift to shorter wavelength by the quantum size effect becomes noticeable. Also, in some cases, effect by the electric-field-distribution-control layer may vary due to variation of growing temperature per a batch at manufacturing.

From the above matter, the layer thickness equal to or greater than 10 nm is preferable for restraining quantum size effect. In addition, from the reason similar to the above matter, it is preferable that thickness of each one of the second semiconductor layer is 10 to 50 nm.

From a view point of restraining a dual-peak electric field distribution shape, it is preferable to dispose first semiconductor layers and second semiconductor layers each having a plurality of thicknesses alternately.

In case where the first semiconductor layer is made from InP, in order to make the total thickness of the second semiconductor layer equal to or smaller than 1 μm, it is preferable to make a period of repeating the first semiconductor layers and the second semiconductor layer 20 to 100 periods.

Also, in case where the first semiconductor layer is made from GaInAsP, 10 to 50 periods are preferable in order to make the total thickness of the second semiconductor layer equal to or smaller than 1 μm.

It should be noted that, although herein GaInAsP of which lattice matching degree is −0.05% to 0.05% is used, a crystal having less defect can be realized even when the total thickness of the GaInAsP is made equal to or greater than 1 μm by a strain compensation structure in which the first semiconductor layer and the second semiconductor layer have positive and negative lattice constants relative to lattice constants of substrates, respectively. In this case, the period is not limited. It should be noted that the respective total thicknesses of the first semiconductor layer and the second semiconductor layer are layer thicknesses equal to or smaller than critical thicknesses defined based on lattice mismatching degree.

Also, preferable compositions for the first semiconductor layer and the second semiconductor layer are GaInAsP having band gaps which satisfy the following formulae.

That is, the first semiconductor layer satisfies $0 \leq E1/E0 < 0.35$ and the second semiconductor layer satisfies $0.13 \leq E1/E0 < 0.71$ where a difference between a band gap of the n-InP cladding layer 2 and a band gap of a barrier layer constituting the active layer 3 is E0 (eV) and a difference between a band gap of the n-InP cladding layer 2 and a band gap of a GaInAsP layer constituting the electric-field-control layer is E1 (eV). By using GaInAsP satisfying these conditions for the electric-field-control layer, it is possible to drive a semiconductor laser module of which optical output at an end of a fiber is equal to or greater than 300 mW with low power consumption.

It should be noted that, although the semiconductor layer in the electric-field-distribution-control layer 12 is configured so that band gap energy is greater when leaving away from the GRIN-SCH-MQW active layer 3, a configuration in which band gap energy is greater when being closer to the active layer 3 is applicable.

It should be noted that, although the semiconductor laser element according to the embodiment 1 is a semiconductor laser element formed on the InP substrate and uses the electric-field-distribution-control layer 12 which is configured by the InP layer and the GaInAsP, an electric-field-distribution-control layer configured by an InP layer and an AlGaInAsP layer may be used. Also, an electric-field-distribution-control layer configured by a GaAs layer and an AlGaInAsP layer can be used in a semiconductor laser element formed on a GaAs substrate.

Next, a lower side SCH layer having 40.8 nm of layer thickness is formed by layering non-doped-GaInAsP layers having 0.95 μm, 1.0 μm, 1.05 μm, 1.1 μm, and 1.15 μm of composing wavelengths. After that, a well layer made from GaInAsP and a barrier layer made from GaInAsP are grown on the lower side SCH layer alternately, and an active layer having a multi quantum well structure in which the number of well layers is three is formed. In the present embodiment 1, the layer thicknesses and compositions of the well layer and the barrier layer are set so that oscillation wavelength is 1415 nm. A compressive strained quantum well structure of which lattice mismatching degree relative to the InP substrate is approximately 1% is applied to the well layer.

It should be noted that, since net strain amount of strained quantum well active layer can be reduced by introducing a strain compensation structure having a barrier layer into which tensile strain is introduced, a compressive strained quantum well structure of which lattice mismatching degree of a quantum well layer is equal to or greater than 1% is applicable.

In addition, in case where Zn is used as p-type impurity, since the diffusion coefficient of Zn is great, Zn diffuses in the active layer by a thermal process in manufacturing process (for example, growing temperature etc. at regrowth when forming a BH structure), problems such as decrease in optical output of the semiconductor laser element and increase in threshold current occur, and in particular, in a pumping light source for use of a fiber amplifier, the decrease in optical output is a problem. To address this, the present embodiment 1 has a structure in which Zn is suppressed to diffuse into the active layer by doping the active layer with 0.3 to $1 \times 10^{18}/cm^3$ of n-type impurity.

Next, an upper side SCH layer having 40.8 nm of layer thickness is formed on the active layer by layering non-doped-GaInAsP having 0.95 μm, 1.0 μm, 1.05 μm, 1.1 μm, and 1.15 μm of composing wavelengths. The above described lower side SCH layer, the active layer of the multi quantum well structure, and the upper side SCH layer constitute the GRIN-SCH-MQW active layer 3.

After that, a lower layer portion of the p-InP cladding layer, which is made of InP of which impurity density is 3 to $9 \times 10^{17}/cm^3$ and of which thickness is 0.5 μm is grown on the upper side SCH layer.

Figure 3:
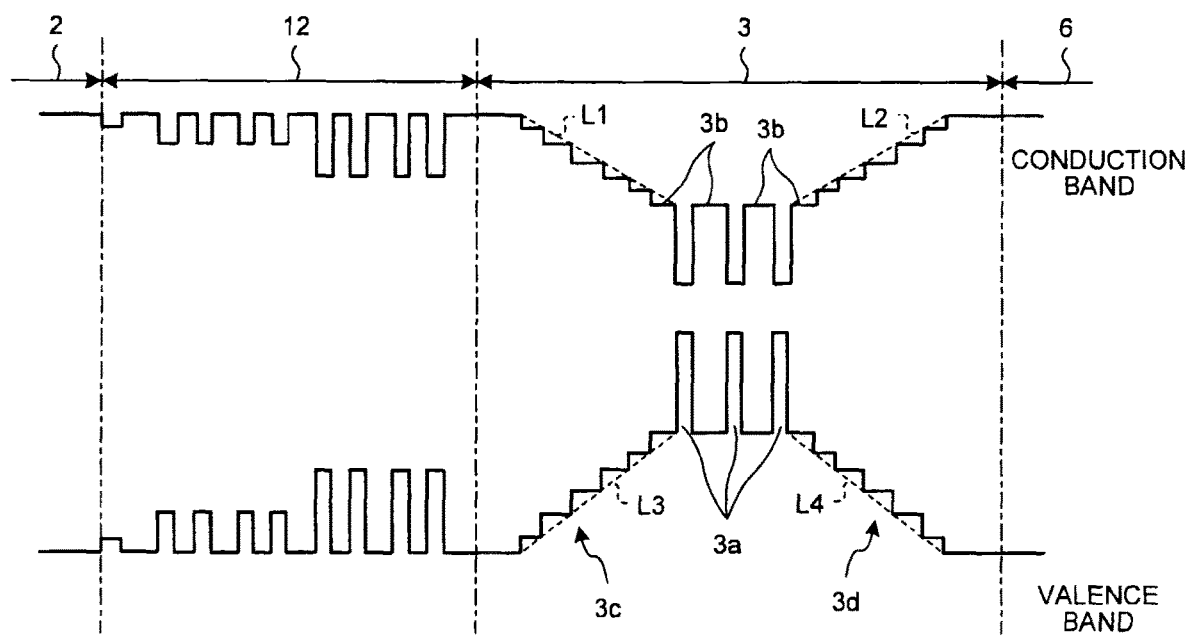
FIG. 3 is a drawing showing a band diagram of the semiconductor laser element according to the embodiment 1.

Herein FIG. 3 is a drawing showing a band diagram around the GRIN-SCH-MQW active layer 3 of the semiconductor laser element according to the embodiment 1. A well layer 3a and a barrier layer 3b are layered alternately and sandwiched by a lower-side SCH layer 3c and an upper side SCH layer 3d. Layer thicknesses and compositions of the lower-side SCH layer 3c and the upper side SCH layer 3d which are GRIN-SCH and GaInAsP constituting the outermost barrier layer 3b are set so that band gaps of respective layers are disposed linearly as shown by dotted lines L1, L2, L3, and L4. This is because efficiency of injecting carriers into the active layer is increased by realizing a quasi-linear SCH structure. It should be noted that there is no problem since, even if it is not linearly, carriers can be injected efficiently into the active layer as long as the dotted lines L1 and L2 form a band diagram having an upwardly projecting shape and the dotted lines L3 and L4 form a band diagram having a downwardly projecting shape and the two projecting shapes face each other. Also, if it is possible to control compositions strictly, it is no problem to use a linear SCH structure in which a III group element and a V group element which are composition elements vary continuously.

It should be noted that, as an crystal-growing method other than MOCVD method, molecular beam epitaxy (MBE) method or chemical beam epitaxy (CBE) method may be used.

After that, an SiNx layer is deposited on the entire surface by the thickness of approximately 120 nm by plasma CVD method etc. and formed into a stripe shape by a photolithography process to form an etching mask, and a mesa shape is formed by being immersed in wet etching solution and the etching mask being used as an etching mask, so that a curved face is obtained and no particular plane orientation is exposed. In this state, the mesa is formed so that the electric-field-distribution-control layer 12 remains with the thickness of approximately 1 μm in a region in which the p-InP current block layer 8 and the n-InP current block layer 9 are formed.

Although it is manufactured by using wet etching in the present manufacturing method, there is no problem if a mesa is formed by a process of dry etching and subsequent wet etching in order to removing a damage layer formed by the dry etching. From a view point of uniformity within a surface of the active layer width, the latter process is desirable.

Subsequently, the p-InP current block layer 8 and the n-InP current block layer 9 are layered by MOVPE method by making use of the SiNx layer as a selective growth mask to bury two sides of the mesa, and after that, the SiNx layer is removed.

After that, an upper layer portion of the p-InP cladding layer made from InP of which impurity density is 5 to $7 \times 10^{17}/cm^3$ is grown on the entire surface by the thickness of 3.5 μm, and furthermore, the p-GaInAsP contact layer 7 made from GaInAsP of which impurity density is approximately $5 \times 10^{18}/cm^3$ is grown by the thickness of 0.5 μm.

The p-InP cladding layer 6 is configured to have 4.0 μm of thickness which is the sum of the lower layer portion of the p-InP cladding layer of which thickness is 0.5 μm and the upper layer portion of the p-InP cladding layer of which thickness is 3.5 μm.

Then, a p-side electrode 10 is formed on an upper surface of the p-GaInAsP contact layer 7 and an n-side electrode 11 is formed at a lower side of the n-InP substrate 1, and after that, it is cut with a length of 2 mm and is given a reflection-side reflecting coating 14 and a output-side reflecting coating 15 to form a laser structure. By doing this way, the semiconductor laser element according to the embodiment 1 is finished.

Figure 4A:
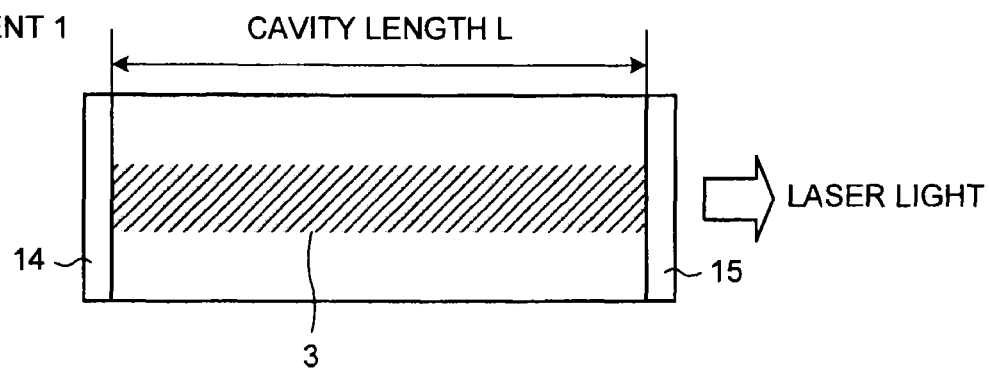
FIG. 4A is a drawing showing a stripe shape in the waveguide direction of light in the semiconductor laser element according to the embodiment 1.
Figure 4B:
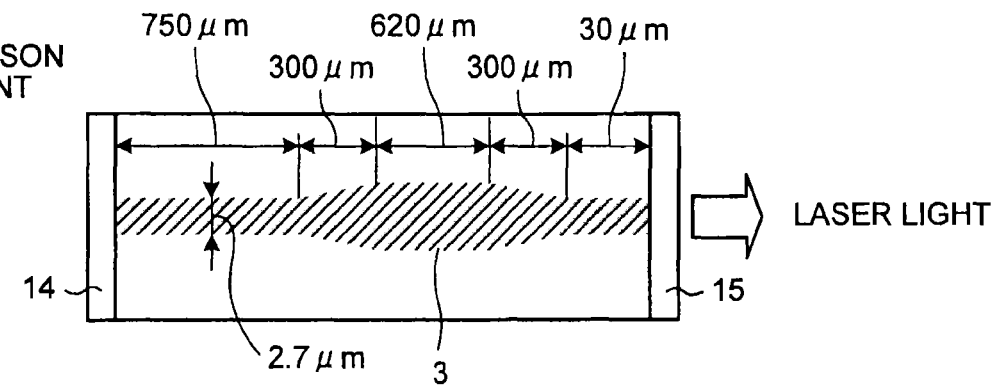
FIG. 4B is a drawing showing a stripe shape in the waveguide direction of light in a comparison element.

FIGS. 4A and 4B are drawings showing stripe shapes in the waveguide direction of light in the semiconductor laser element according to the embodiment 1 and a comparison element respectively. The comparison element is a conventional Fabry-Perot type semiconductor laser element which is not provided with the electric-field-distribution-control layer 12. Herein the comparison element has a layered structure identical with the semiconductor laser structure according to the embodiment 1 except that the thickness of the n-InP cladding layer 2 is 1.3 μm and the comparison element does not include the electric-field-distribution-control layer 12.

As shown in FIG. 4A, regarding the present embodiment 1, the semiconductor laser element, in which the width of the GRIN-SCH-MQW active layer 3 has an approximately 4.3 μm of active layer width along the waveguide direction of light, was manufactured.

Also, as shown in FIG. 4B, in order to control a single transverse mode, the comparison element was configured to have a waveguide structure of light in which active layer width of the GRIN-SCH-MQW active layer along the waveguide direction of light is configured by linear regions (length of 30 μm: a light-output-side region, 750 μm: a light-reflecting side region) in which the active layer width is 2.7 μm and a region (length 620 μm) which is provided with a linear active layer width which is wider than width in the vicinity of the light-output-end surface and is sandwiched by regions (length 300 μm) varying in a taper manner. It should be noted that, the active layer width of the comparison element is defined by a value obtained by dividing the area of the active layer by the length of the cavity. For example, the comparison element having 4.3 μm of active layer width is realized by adjusting the taper region and the linear active layer width which is wider than width in the vicinity of the light-output-end surface so that the area of the active layer is 8.6 μm². It should be noted that, since the single transverse mode can be maintained at 2.7 μm of active layer width, the structure of the comparison element was made a linear stripe structure. By doing this way, it is a structure of controlled single transverse mode control and preventing optical output saturation due to heat when injecting high electric current.

Figure 5:
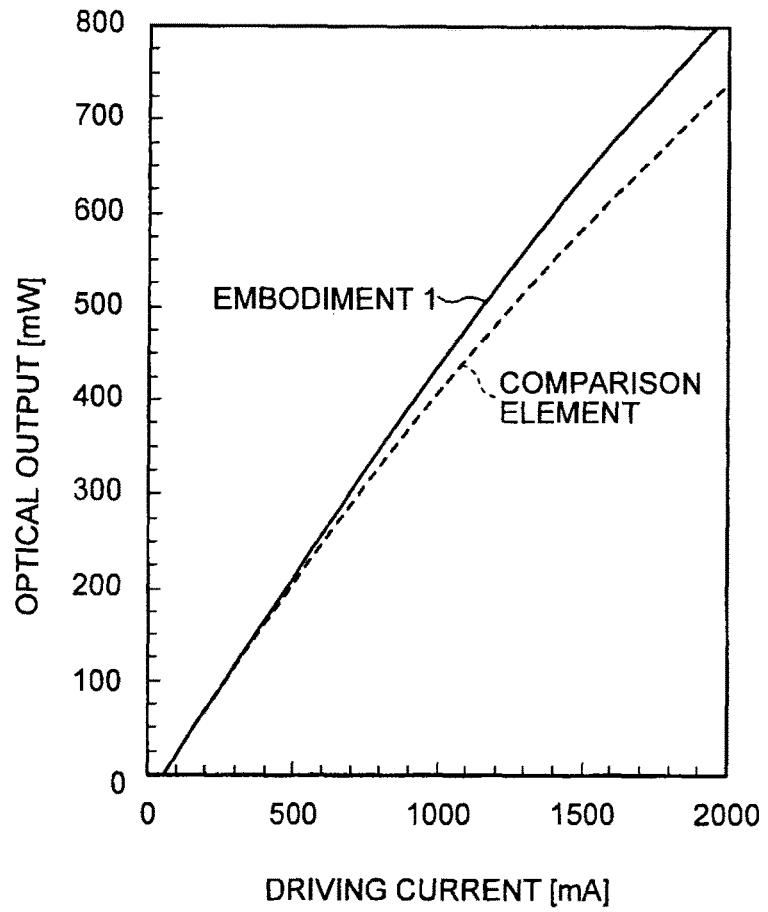
FIG. 5 is a drawing showing current-optical output characteristics of the semiconductor laser element according to the embodiment 1 and the comparison element.

FIG. 5 is a drawing showing current-optical output characteristics of the semiconductor laser element according to the embodiment 1 and a comparison element.

It is found that, although the semiconductor laser element according to the present embodiment 1 and the comparison element have stripes having 4.3 μm of width, in the characteristics of FIG. 5, a kink which is a discontinuous point is not generated and high power output operation equal to or greater than 800 mW is achieved.

This is caused by an effect of reducing a refractive index difference between a current-confining region and an active layer region because approximately 1 μm of thickness of the electric-field-distribution-control layer 12 remains in a region in which the p-InP current block layer 8 and the n-InP current block layer 9 are formed.

Also, as shown in FIG. 5, when driving current is 1800 mA, the optical output of the semiconductor laser element according to the embodiment 1 shows power output higher than the optical output of the comparison element by approximately 70 mW. This is because inter valence band absorption in the p-InP cladding layer 6 reduced and external quantum efficiency increased along with reduction in internal loss since the electric-field-distribution-control layer 12 is applied to the semiconductor laser element of the present embodiment 1.

From the above description, although a complex waveguide structure as shown in FIG. 4 was applied to the comparison element in order to control the single transverse mode, the semiconductor laser structure according to the present embodiment 1 obtains an effect of enabling single transverse mode control with a simple structure and realizing a semiconductor laser with efficiency higher than that of the comparison element by applying the electric-field-distribution-control layer 12.

Figure 6:
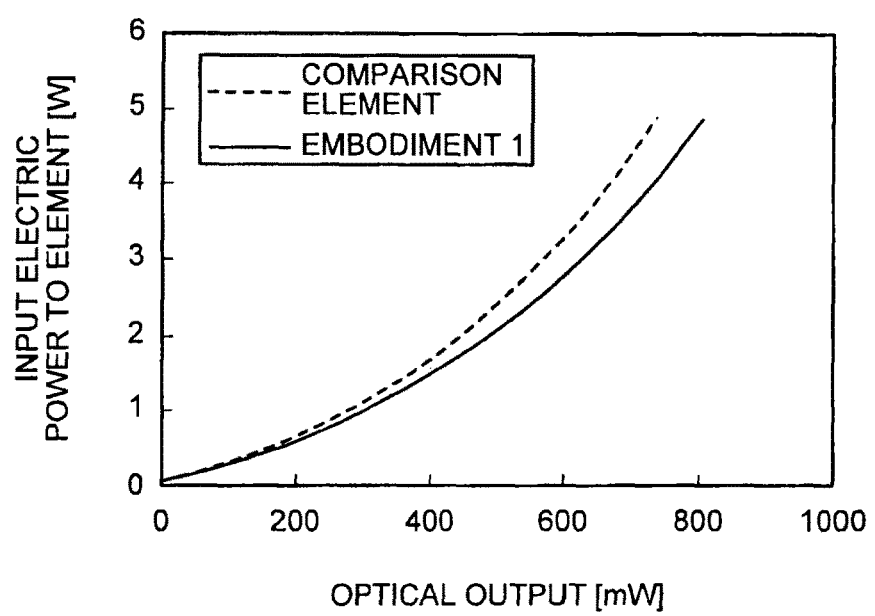
FIG. 6 is a drawing showing dependences of electric input power on optical output of the semiconductor laser element according to the embodiment 1 and the comparison element.

FIG. 6 is a drawing showing dependences of electric input power on optical output of the semiconductor laser element according to the embodiment 1 and the comparison element. As compared with the comparison element, the semiconductor laser element according to the present embodiment 1 has an effect of being able to drive over a wide range from a low power output side to 800 mW of high power output with low power consumption.

It should be noted that it is needless to say that a high power output pumping light source for use of a Raman amplifier at 1400 nm to 1550 nm can be realized with low power consumption by optimizing thickness or composition of the quantum well active layer in the semiconductor laser element according to the present embodiment 1.

Also, although the present embodiment 1 is a linear mesa-stripe structure in which the width of the active layer is equal with respect to the direction of propagation of light, a structure maintaining the single transverse mode in which stripe width varies with respect to the direction of propagation of light, such as, for example, a taper structure or an active MMI structure may be used. Also, since the active layer width can be equal to or greater than 3 μm in the present embodiment 1, in case where it is applied to the comparison element structure, the active layer width of the linear region of the light-output end face can be expanded, and the area of the active layer can be increased to a greater extent.

As a result, element resistance can be reduced, and a low power-consuming semiconductor laser element can be realized.

Although the present embodiment 1 is a semiconductor laser element having a BH structure, the present invention can be applied to a ridge-stripe type laser or an SAS type laser easily.

Also, although the present embodiment 1 is a semiconductor laser element, the present invention can be applied to various aspects of a wavelength-variable laser, for example, an MOPA structure, a semiconductor optical amplifier, or an element, in which optical functions are integrated, such as a modulator-integrated laser or wavelength-variable laser in which a plurality of functions are integrated on a same substrate. The functions include to select a specific wavelength by returning (feedbacking) a specific wavelength in the wavelength-variable laser. Such wavelength-variable laser includes, for example, a Distributed FeedBack (DFB) laser.

To enable a high-output DFB laser oscillating in a single mode, it is formed in a laser element a diffracting grating that obtains a product κLg of a coupling coefficient κ of the diffracting grating and a length Lg of the diffracting grating from 0.6 to 1.0, more preferably, from 0.7 to 0.8. It is formed, more preferably, on the front end surface a dielectric reflection film having a reflectance less than that of the back end surface to obtain an optical output efficiently.

Although a dielectric reflection film is used herein, a reflection structure including a semiconductor diffracting grating may be used.

The maximum of Lg is the element length L, and the diffracting grating is formed for a part of or the entire length of the laser element. The element length L is 300 μm or longer and, preferably, 1000 μm or longer. In light of low-cost manufacture, the element length L is preferably 5000 μm or shorter.

The diffracting grating is preferably formed on a side of the active layer opposite to a side where the electric-field adjusting layer is. This is because if the diffracting grating and the electric-field adjusting layer are on the same side, the optical confinement of the active layer vary because of production tolerance during the process of forming the diffracting grating layer, which causes difficulty in maintaining a high manufacturing yield. In addition, with this structure, the optical confinement of the diffracting grating is less as compared to when the diffracting grating and the electric-field adjusting layer are on the same side, and the above-mentioned κ can be achieved with a good reproducibility.

Moreover, to improve operating characteristics under a high temperature, the number of strained quantum well layers of the active layer formed is preferably six or more. A reason therefor is explained below. A related-art laser structure having no electric-field adjustment aims to achieve low loss for purpose of high output and achieves the aim by decreasing the number of well layers or decreasing p-type impurity. This, however, makes temperature characteristics poor due to an impact of heat generated by carrier overflow or an increase in the driving voltage.

Because a strained super lattice is used in the quantum well active layer, the thickness of the entire active layer is adjusted to a value equal to or less than a critical film thickness such that no dislocation occurs in the crystal. To use an active layer having higher strain, it is allowable to employ such structure in which a strained super lattice that cancels strain of the well layers is introduced to the barrier layer so that the amount of strain in the entire active layer becomes zero.

Although it is described herein about a DFB laser oscillating with a high-output single mode, the laser selecting a particular wavelength may be a laser element oscillating with multiple modes. To achieve this, κLg is preferably set to 0.3 or less. When the diffracting grating is to be formed for the entire element length, this can be achieved by usage of a high-order diffracting grating.

In light of selecting a particular wavelength, not only a DFB laser but also a DR laser having a wavelength selectable reflection structure on at least one of the front end surface or the back end surface are allowable.

As semiconductor laser elements according to embodiments 2-1 and 2-2 of the present invention, a semiconductor laser element in which the configuration of an electric-field-distribution-control layer 12 is different from the embodiment 1 is manufactured, and laser characteristics thereof were compared with the semiconductor laser element according to the embodiment 1 and the comparison element.

The embodiment 2-1 is a semiconductor laser element having an electric-field-distribution-control layer 12 which is configured by 8 periods of a GaInAsP layer of which composing wavelength is 0.95 μm and thickness is 20 nm, an InP layer of which thickness is 180 nm, a GaInAsP layer of which composing wavelength is 1.1 μm and thickness is 20 nm, and an InP layer of which thickness is 180 nm, and the total thickness of the electric-field-distribution-control layer 12 is 1800 nm. Also, the embodiment 2-2 is a semiconductor laser element having an electric-field-distribution-control layer 12 which is configured by 4 periods of a GaInAsP layer of which composing wavelength is 0.95 μm and thickness is 20 nm, an InP layer of which thickness is 180 nm, a GaInAsP layer of which composing wavelength is 1.0 μm and thickness is 100 nm, and an InP layer of which thickness is 300 nm, and 4 periods of a GaInAsP layer of which composing wavelength is 1.0 μm and thickness is 40 nm and an InP layer of which thickness is 360 nm, and the total thickness of the electric-field-distribution-control layer 12 is 3400 nm.

In the embodiment 2-1, the total thickness of the GaInAsP layer included in the electric-field-distribution-control layer 12 is 180 nm which is 10.0% of the total thickness (1800 nm) of the electric-field-distribution-control layer 12. In the embodiment 2-2, the total thickness of the GaInAsP layer is 580 nm which is 17.1% of the total thickness (3400 nm) of the electric-field-distribution-control layer 12.

Optical confinement coefficients of the active layers by calculation are 0.9% in the embodiment 1, 0.97% in the embodiment 2, and 0.91% in the embodiment 2-2, and as compared with 1.1% in the comparison element, they are structures in which confinement is slightly small.

Also, values of internal losses are 2.7/cm in the embodiment 1, 2.5/cm in the embodiment 2, and 2.4/cm in the embodiment 2-2 which are approximately the same and estimated to be values smaller than 3.8/cm in the comparison element, and a possibility that external differential quantum efficiency may be enhanced due to reduction in inter valence band absorption can be expected.

When IL kink (discontinuous point of optical output) is generated in a semiconductor laser element, a high-order lateral mode is generated in a current injection region following the point where the kink is generated.

This causes a problem that, when laser light is coupled to an optical fiber via a lens, coupling efficiency deteriorates to a great extent, and a high power output semiconductor laser module cannot be realized.

In addition, although an optical fiber amplifier is used by controlling driving current automatically so that optical output is constant (APC-driven), there is a problem that APC control is not possible when there is IL kink. From the above matter, it is important that a kink is not generated within a range of driving current of a pumping light source for use in an optical fiber amplifier.

Figure 7:
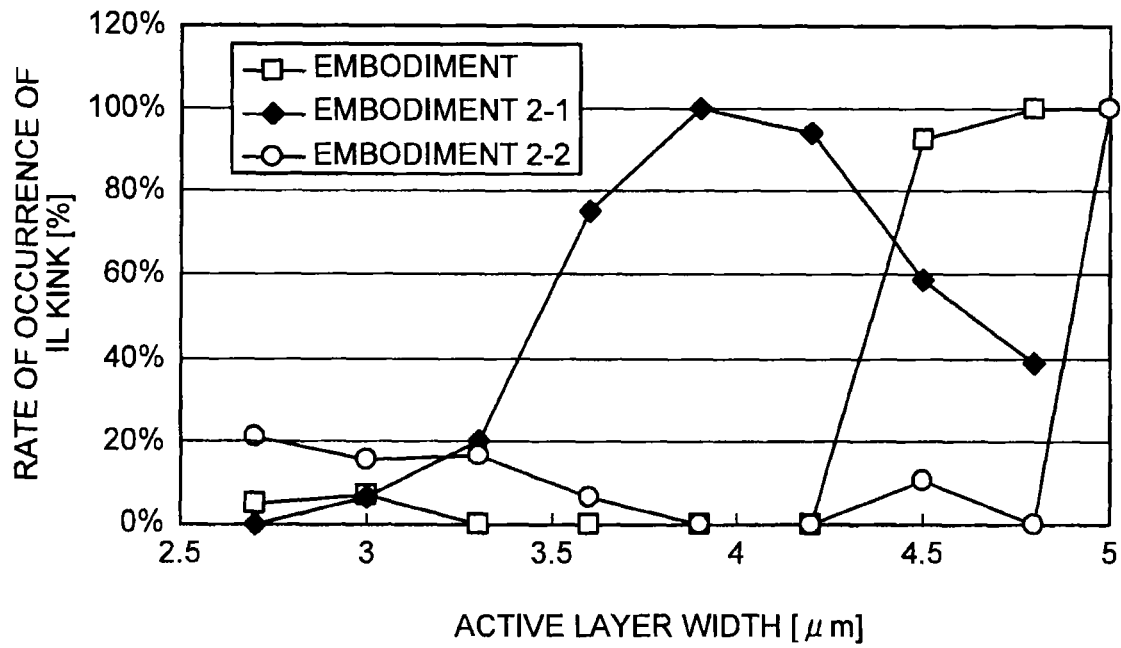
FIG. 7 is a drawing showing a relationship between an active layer width and a rate of occurrence of IL kink of each of the semiconductor laser elements according to embodiments 1, 2-1, and 2-2.

FIG. 7 is a drawing showing a relationship between an active layer width and a rate of occurrence of IL kink of the semiconductor laser element according to the embodiments 1, 2-1, and 2-2. Rate of occurrence of IL kink increases when the active layer width is greater than 4.3 μm in the semiconductor laser element according to the embodiment 1 or when the active layer width is greater than 3.3 μm in the semiconductor laser element according to the embodiment 2-1. In contrast to this, it is found that, in the semiconductor laser element according to the embodiment 2-2, the rate of occurrence of the IL kink is restrained even when the active layer width is 4.8 μm.

Herein, in the embodiment 1, the thickness (remaining thickness) of the electric-field-distribution-control layer 12 remaining in a lower layer of the p-InP current block layer 8 constituting the BH structure for confining current is 1 μm (0.95 μm composition wavelength GaInAsP/InP=20 nm/180 nm, 1 μm composition wavelength GaInAsP/InP=(60 nm/140 nm)×4 periods) among which the thickness of the GaInAsP layer is 260 nm.

On the other hand, in the embodiment 2-2, the remaining thickness of the electric-field-distribution-control layer 12 in the lower layer of the p-InP current block layer 8 is 1.2 μm (0.95 μm composition wavelength GaInAsP/InP=20 nm/180 nm, 1 μm composition wavelength GaInAsP/InP=(100 nm/300 nm)×4 periods) among which the thickness of the GaInAsP layer is 420 nm. Similarly, in the embodiment 2-1, the remaining thickness of the electric-field-distribution-control layer 12 is 0.2 μm (0.95 μm composition wavelength GaInAsP/InP=20 nm/180 nm) among which the thickness of the GaInAsP layer is 20 nm.

From the above matter, it is found that, if the remaining thickness of the electric-field-distribution-control layer 12 is greater, the thickness occupied by the GaInAsP layer increases, refractive index difference between the BH region and the active layer region is reduced, and high power output operation can be realized without generating a kink even if the active layer width is wide. It should be noted that, if the remaining thickness is equal to or greater than 0.2 μm, generation of a kink can be restrained even if the active layer width is wide, i.e., equal to or greater than 3 μm.

Figure 8:
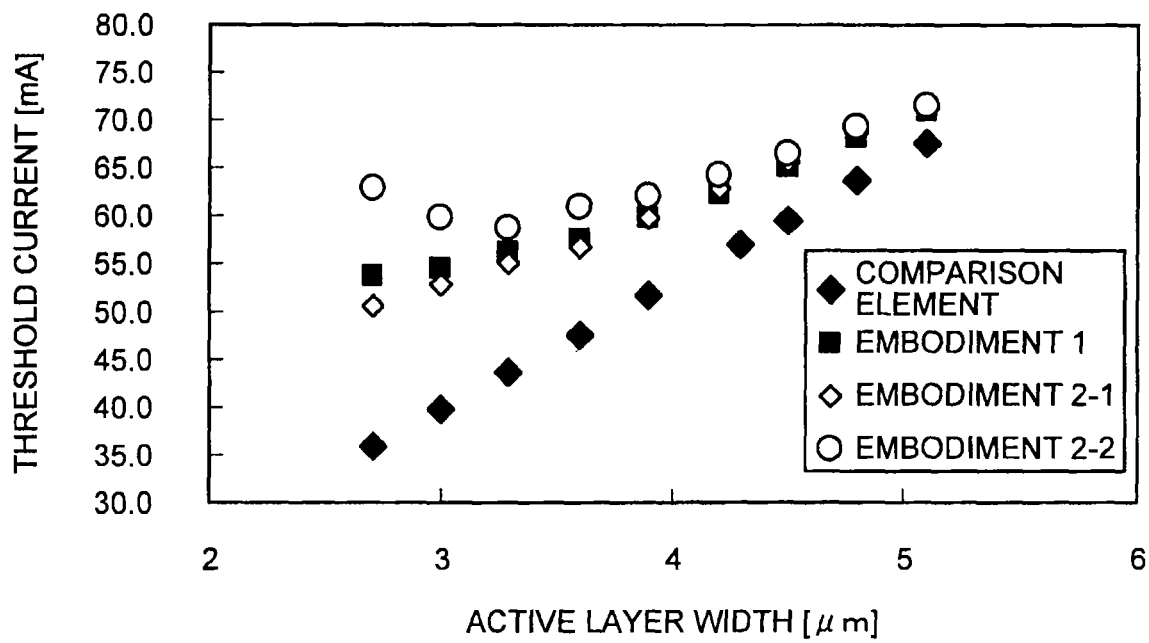
FIG. 8 is a drawing showing dependence of threshold current on the active layer width of each of the semiconductor laser elements according to the embodiments 1, 2-1, and 2-2 and the comparison element.

FIGS. 8 to 11 are drawings showing dependence of static characteristics of the semiconductor laser element on the active layer width. FIG. 8 is a drawing showing dependence of threshold current on the active layer width of each of the semiconductor laser elements according to the embodiments 1, 2-1, and 2-2 and the comparison element.

As shown in FIG. 8, the threshold current of the semiconductor laser element according to the embodiments 1, 2-1, and 2-2 exhibits a great value as compared with that of the comparison element. As compared with 4.3 μm of the active layer width, it is greater by approximately 5 mA.

This is because, by introducing the electric-field-distribution-control layer 12, an electric field is distributed at n-InP substrate side and confinement of light decreases in the active layer.

Comparison among semiconductor laser elements according to the embodiments 1, 2-1, and 2-2 shows tendency that difference among threshold current of the respective embodiments decreases along with increase in the active layer width. In addition, in the embodiment 1 or the embodiment 2-2, threshold current increases when the active layer width is smaller than a certain active layer width. This is considered because density of carriers injected into the active layer increases along with decrease in the active layer width, non-radiative recombination component in the electric-field-distribution-control layer 12 increases, and efficiency of injecting current into the active layer is reduced. In particular, it is found that, along with increase in the total thickness of the GaInAsP layer included in the electric-field-distribution-control layer 12, that is, increase in the threshold current in a region in which active layer width is small becomes greater in the structure of the embodiment 2-2 than in the structure of the embodiment 1. The increase in threshold current caused by this increase in the total thickness of the GaInAsP layer can be avoided by reducing carrier density by setting the active layer width at equal to or greater than 3.3 μm, more preferably, equal to or greater than 4.3 μm.

Figure 9:
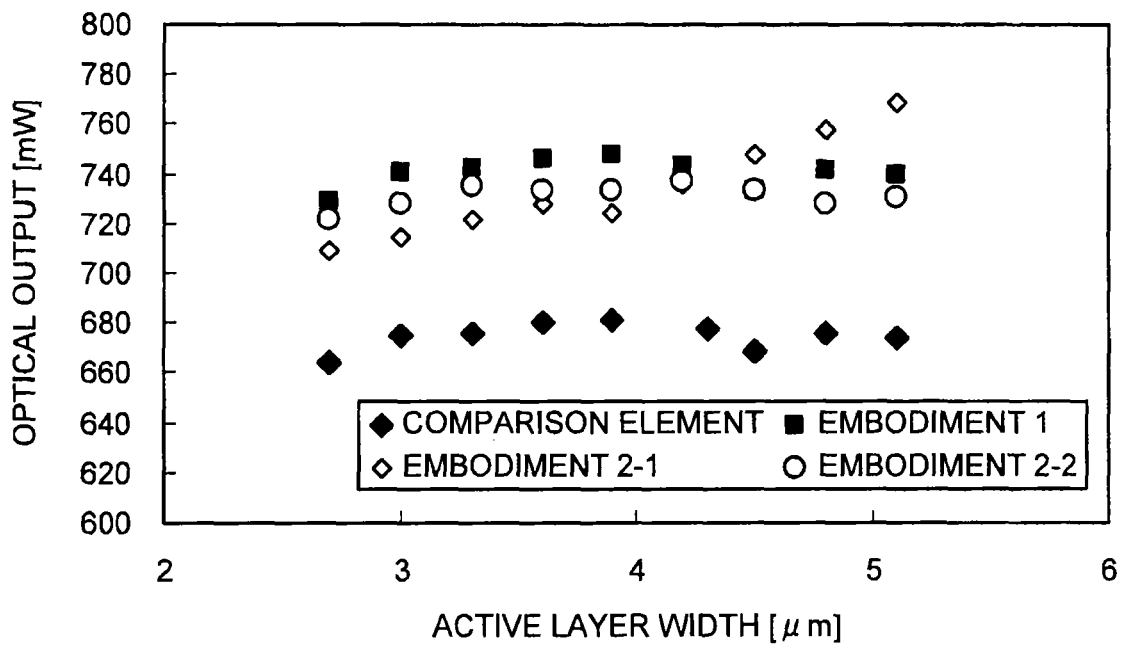
FIG. 9 is a drawing showing dependence of optical output (when driving at 1.8 A) on the active layer width of each of the semiconductor laser elements according to the embodiments 1, 2-1, and 2-2 and the comparison element.

FIG. 9 is a drawing showing dependence of optical output (when driving at 1.8 A) on the active layer width of each of the semiconductor laser element according to the embodiments 1, 2-1, and 2-2 and the comparison element. In the semiconductor laser elements according to the embodiment 1 and the embodiments 2-1 and 2-2, higher power output than optical output of the comparison element by approximately 30 to 70 mW is achieved. This is also effect caused by the above described reduction in the inter valence band absorption. It should be noted that, in case of the comparison element, output is approximately 660 mW to 680 mW at 2.7 μm to 5.1 μm of the active layer width.

It is found that, among the structures of the three embodiments, optical output is the greatest within a range of 2.7 μm to 4.2 μm of the active layer width in the structure of the embodiment 1 in which the electric-field-distribution-control layer 12 has an intermediate layer thickness, and there is an optimum value in the layer thickness of the electric-field-distribution-control layer 12.

That is, it is found that, since there is a trade-off relationship regarding the above described single transverse mode control and high power output operation, optimization of the electric-field-distribution-control layer 12 is important to realize an operation with low power consumption and high power output in the semiconductor laser element having the electric-field-distribution-control layer 12.

It was found that, in order to realize 99.7% of yield rate at which the semiconductor laser module of which fiber-end optical output is 500 mW is operated with driving current which is equal to or lower than 10 W, optical output which is equal to or greater than 725 mW is necessary when driving at 1.8 A. The optimum range of the total thickness of the electric-field-distribution-control layer 12 obtained from this finding and the results of the respective embodiments in which the active layer width of is 3.9 μm in FIG. 9 is 1.8 μm to 3.5 μm.

Figure 10:
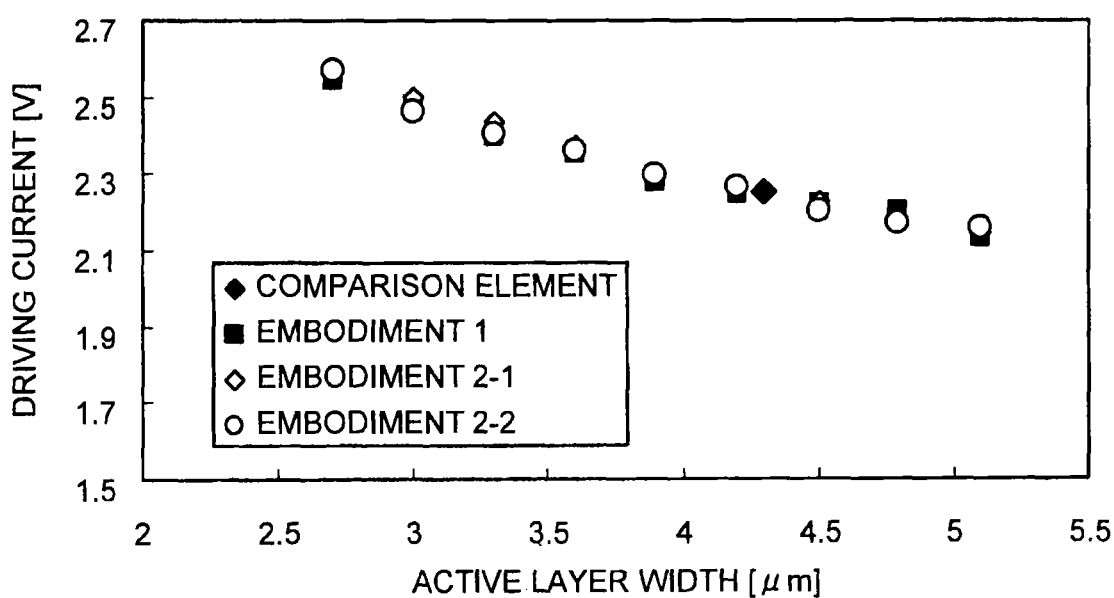
FIG. 10 is a drawing showing dependence of driving voltage (when driving at 1.8 A) on the active layer width of each of the semiconductor laser elements according to the embodiments 1, 2-1, and 2-2 and the comparison element.
Figure 11:
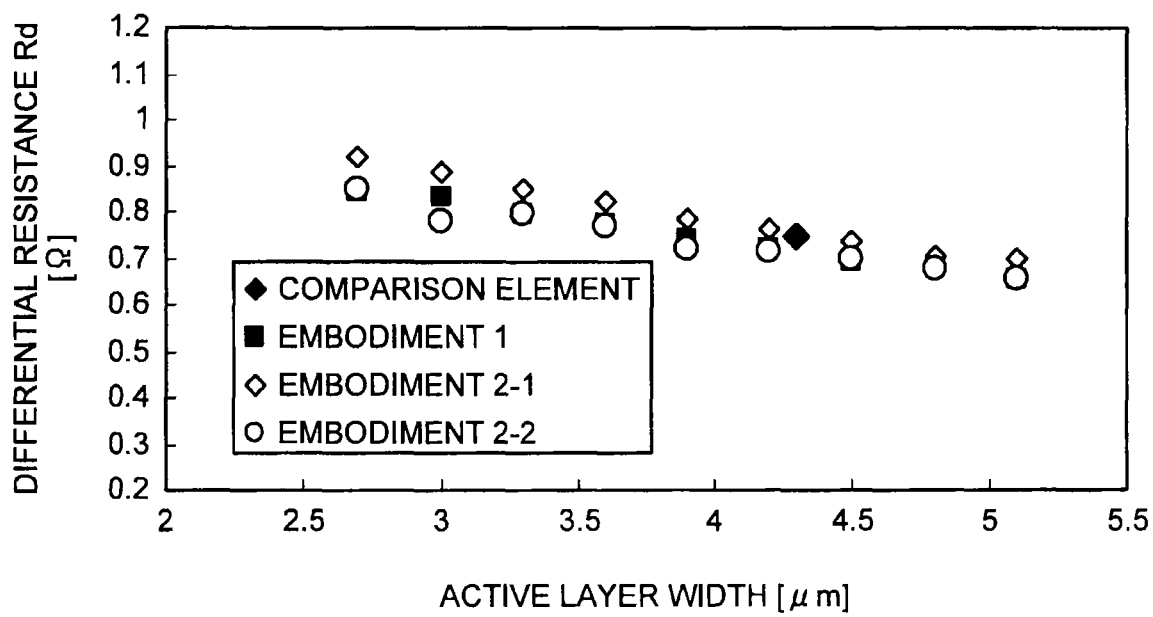
FIG. 11 is a drawing showing dependence of differential resistance (when driving at 1.8 A) on the active layer width of each of the semiconductor laser elements according to the embodiments 1, 2-1, and 2-2 and the comparison element.

FIG. 10 is a drawing showing dependence of driving voltage (when driving at 1.8 A) on the active layer width of each of the semiconductor laser elements according to the embodiments 1, 2-1, and 2-2 and the comparison element. FIG. 11 is a drawing showing dependence of differential resistance (when driving at 1.8 A) on the active layer width of each of the semiconductor laser elements according to the embodiments 1, 2-1, and 2-2 and the comparison element. In either one of the FIGS. 10 and 11, comparison of driving voltage and differential resistances between the semiconductor laser elements according to the embodiments 1, 2-1, and 2-2 and the comparison element shows similar value at a same active layer width. It should be noted that, at 2.7 μm to 5.1 μm of the active layer width, similar values to those of the semiconductor laser element according to the embodiments 1, 2-1, and 2-2 are shown. From this, it is found that, the electric-field-distribution-control layer 12 having a plurality of hetero interfaces to the extent examined in the present embodiment is characterized in that resistance is small and does not affect electric characteristics.

A semiconductor laser module according to an embodiment 3 of the present invention will be explained.

The semiconductor module according to the present embodiment 3 uses the semiconductor laser element, according to the embodiment 1, having 4.3 μm of active layer width.

Figure 12:
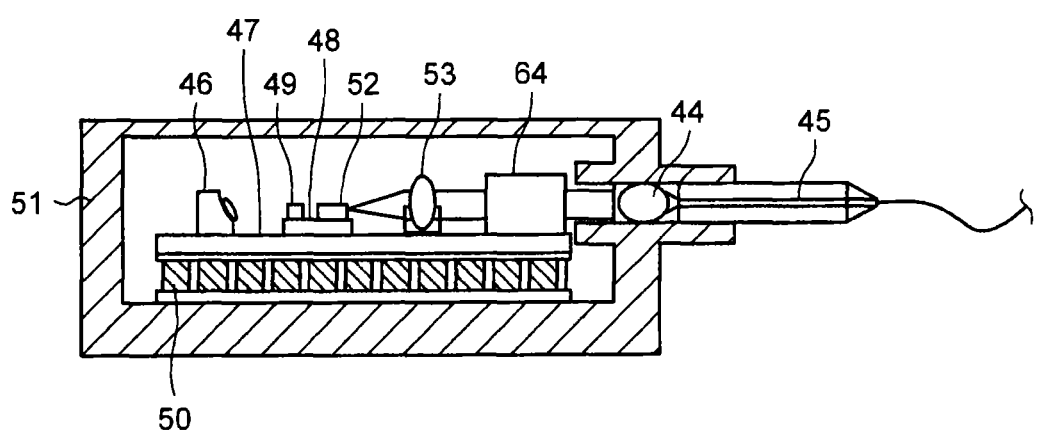
FIG. 12 is a side cross section showing the structure of a semiconductor laser module according to an embodiment 3.

FIG. 12 is a side cross section showing the structure of a semiconductor laser module according to the embodiment 3 of the present invention. The semiconductor laser module according to the present embodiment 3 is provided with a semiconductor laser element 52 which corresponds to the semiconductor laser element according to the above described embodiment 1. It should be noted that this semiconductor laser element 52 has a junction-down configuration in which a p-side electrode is junctioned to a laser mount 48. A temperature-control module 50 as a temperature-control device is disposed on an internal bottom surface of a package 51 which is a casing of the semiconductor laser module according to the present embodiment 3 and is formed by ceramic etc.

A base 47 is disposed on the temperature-control module 50, and the laser mount 48 is disposed on the base 47. Current is given to the temperature-control module 50 for cooling and heating according to its polarity. It should be noted that it functions mainly as a cooler for preventing oscillation wavelength shift due to increase in temperature of the semiconductor laser element 52. That is, the temperature-control module 50 cools the semiconductor laser element 52 and controls to lower temperature in case where wavelength of the laser light is longer than a desirable wavelength, and heats the semiconductor laser element 52 and controls to higher temperature in case where wavelength of the laser light is shorter than a desirable wavelength Specifically, this controlled temperature is controlled based on values detected by a thermistor 49 disposed on the laser mount 48 and in the vicinity of the semiconductor laser element 52. A control device not shown in the drawings usually controls the temperature-control module 50 so that the temperature of the laser mount 48 is maintained constant. In addition, the control device not shown in the drawings controls the temperature-control module 50 so that temperature of the laser mount 48 decreases along with increase in driving current of the semiconductor laser element 52. By performing such temperature control, stability of output from the semiconductor laser element 52 can be enhanced and it is effective for enhancing product yield. It should be noted that it is desirable that the laser mount 48 is formed by material, for example diamond, having high thermal conductivity. This is because generation of heat when applying high electric current is restrained by forming the laser mount 48 with diamond.

The laser mount 48 on which the semiconductor laser element 52 and the thermistor 49 are disposed, a first lens 53 which is a optical-coupling lens system, and a light-receiving element 46 for monitoring light are disposed on the base 47. Laser light outputted from the semiconductor laser element 52 is guided to an optical fiber 45 via the first lens 53, an isolator 54, and a second lens 44 which is an optical-coupling lens system. The second lens 44 is disposed on an optical axis of the laser light and on the package 51 and coupled optically with the optical fiber 45 connected externally thereto. The optical fiber 45 guides the laser light outside thereto. It should be noted that the light-receiving element 46 for monitoring light is for monitoring and detecting light leaking from a high reflection film side of the semiconductor laser element 52 and measuring optical output of the semiconductor laser element 52.

Herein in this semiconductor laser module, an optical isolator 54, which transmits the laser light outputted from the semiconductor laser element 52 at the second lens 44 side, is disposed between the semiconductor laser element 52 and the optical fiber 45 so that reflect return light by other optical component does not return to inside the cavity. It should be noted that, although the isolator 54 of which extinction ratio is −20 dB is used herein, it is preferable to use an isolator equal to or lower than −20 dB in order to restrain reflection from components constituting the module or the system. It should be noted that power consumption of the semiconductor laser module according to the present embodiment was 9 W when optical output at the fiber end was 500 mW. Since, in a laser module using the comparison element of which active layer width was 4.3 μm, power consumption was 11.6 W when optical output at the fiber end was 500 mW, approximately 23% of reduction in power consumption can be realized.

In addition, in case where the semiconductor laser element 52 is constituted by the structure shown in FIGS. 1 and 2, a structure is employed in which a fiber grating as an optical feedback unit returning a part of laser light propagating in the optical fiber 45 to the semiconductor laser element 52 is disposed in the optical fiber 45, and a cavity is formed together with the reflection side of an end surface of the semiconductor laser element 52. In this case, the optical isolator 54 should not be disposed in the semiconductor laser module but must be of an inline type in which the optical isolator 54 is disposed at a stage subsequent to the fiber grating.

As a modification example of the embodiment 3, a semiconductor laser module which does not include an optical isolator in the configuration of the embodiment 3 but has a fiber grating disposed at a part of the optical fiber will be explained. In the modification example according to the present embodiment, a semiconductor laser module having a fiber grating (FBG) is configured by using the semiconductor laser element according to the embodiment 1. It should be noted that characteristics were compared by manufacturing a semiconductor laser module which is provided with a fiber grating by using the comparison element.

It should be noted that characteristics of the FBG used for manufacturing the module are 1.8% of reflectivity, 1.8 nm of reflection band width (full width at half maximum), and 1425 nm of central wavelength.

In the semiconductor laser module using the comparison element, the comparison element described in FIG. 4 and having 4.3 μm of active layer width was used.

In the semiconductor laser according to the embodiment 1, far-field pattern was 11.8° and 16° in the horizontal direction and the vertical direction respectively, and in the comparison element, far-field pattern was 12.5° and 19.6° in the horizontal direction and the vertical direction respectively.

Since more round beam can be realized than the comparison element by the semiconductor laser element according to the embodiment 1 of the present invention, higher efficiency of coupling with an optical fiber is possible. By reduction of driving current and driving voltage by this, an effect of reducing power consumption of the module is obtained.

Figure 13:
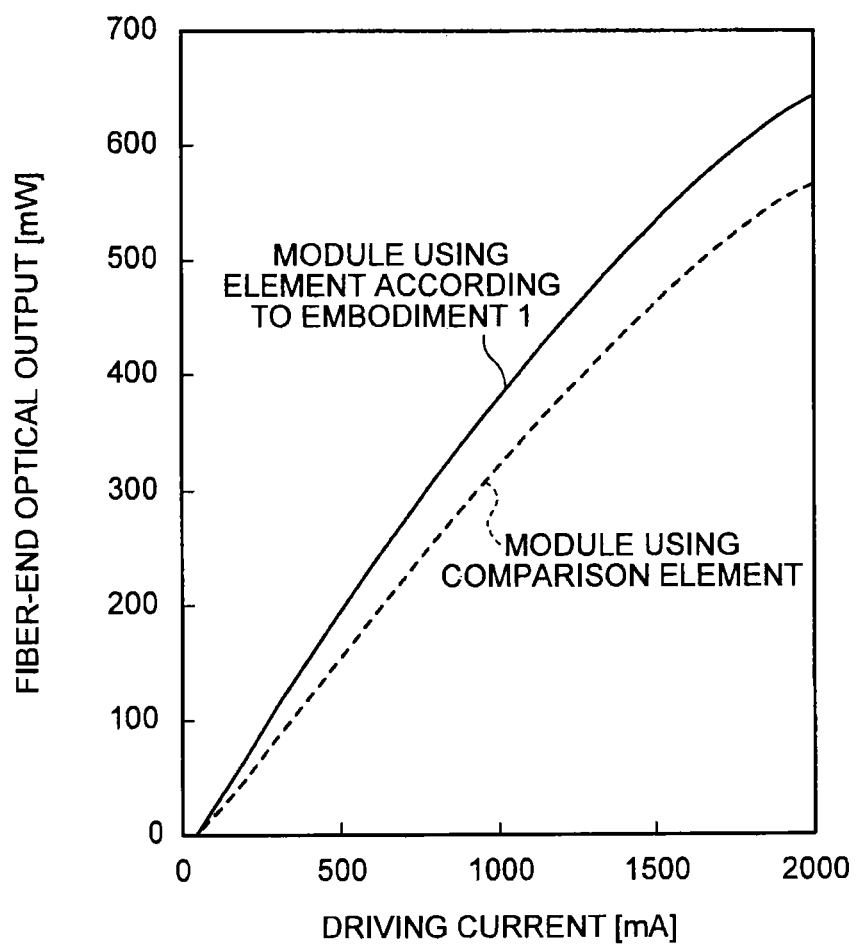
FIG. 13 is a view showing a relationship between optical output at an end of a fiber and driving current of a semiconductor laser module using the element according to the embodiment 1 or the comparison element.

FIG. 13 is a view showing a relationship between optical output at an end of a fiber and driving current of a semiconductor laser module using the element according to the embodiment 1 or the comparison element. Since, in the semiconductor laser module using the element according to the embodiment 1, driving current when optical output at the fiber end is 500 mW is reduced from that of the semiconductor laser module using the comparison element, the above described effect of reducing the power consumption can be confirmed. It should be noted that coupling efficiency for the semiconductor laser module using the element according to the embodiment 1 was confirmed to be 82% and was a value greater than 72% of coupling efficiency for the semiconductor laser module using the comparison element. This is an effect caused by far-field pattern of the element according to the embodiment 1 being varied closer to a more round beam.

Figure 14:
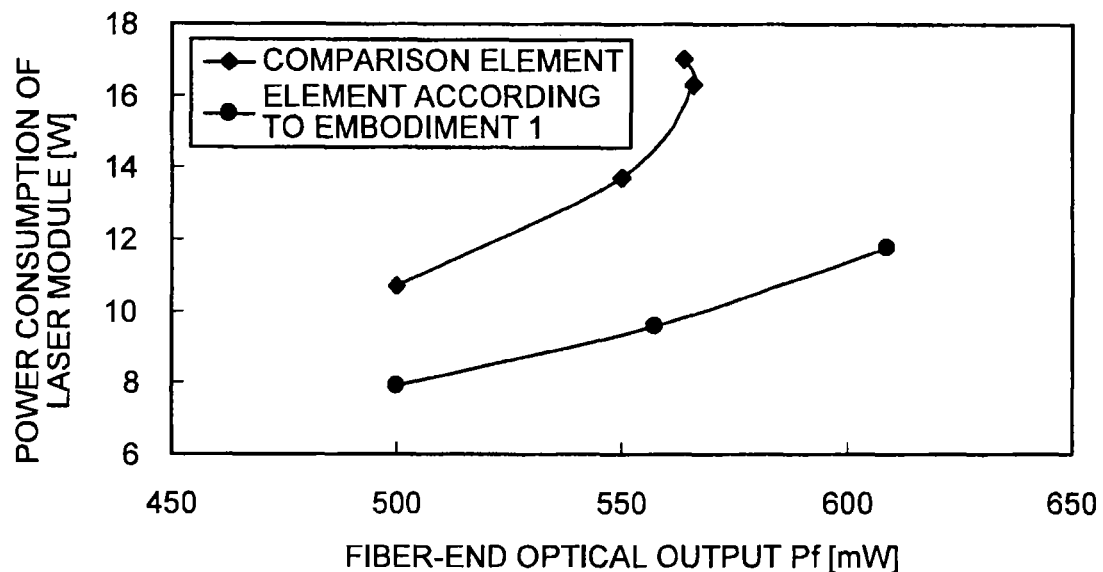
FIG. 14 is a view showing a relationship between optical output at the end of the fiber and power consumption of the semiconductor laser module using the element according to the embodiment 1 or the comparison element.

FIG. 14 is a view showing a relationship between optical output and power consumption at the end of the fiber of the semiconductor laser module using the element according to the embodiment 1 or the comparison element. In the semiconductor laser module using the element according to the embodiment 1, power consumption at 500 mW—optical output at the fiber end is reduced from power consumption of the semiconductor laser module using the comparison element by approximately 2.7 W. In addition, since optical output at the fiber end was 580 mW in case where, in the semiconductor laser module using the element according to the embodiment 1, power consumption was set at power consumption that is the same as when optical output was set at 500 mW at the fiber end of the semiconductor laser module using the comparison element, 16% of improvement is achieved in optical output.

In addition, although power consumption was 16 W when the maximum optical output of the semiconductor laser module using the comparison element was 560 mW, in the semiconductor laser module according to the present embodiment, fiber end optical output which is equal to or greater than 600 mW is obtained at approximately 12 W of power consumption.

From the above matter, there is an effect that high power optical output can be realized with low power consumption by using the semiconductor laser element according to the embodiment 1 in the semiconductor laser module. Also, it was found experimentally that, when reflectivity at output side of the laser light is equal to or lower than 0.5%, more preferably equal to or lower than 0.2%, generation of a kink at high power output can be restrained, and a pumping light source for fiber amplification in which dynamic range is wide from a low output region to a high output region with high power output and stabilized wavelength can be realized.

Figure 15:
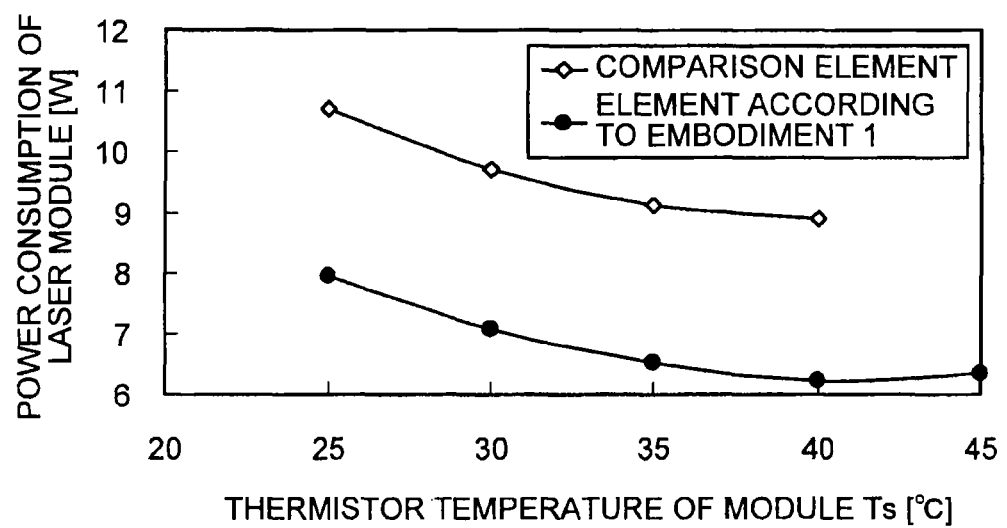
FIG. 15 is a view showing a relationship between module power consumption and thermistor temperature of the semiconductor laser module using the element according to the embodiment 1 or the comparison element at a time of 500 mW optical output from an end of the fiber.

FIG. 15 is a view showing a relationship between module power consumption and thermistor temperature of the semiconductor laser module using the element according to the embodiment 1 or the comparison element at a time of 500 mW—optical output at the fiber end.

FIG. 15 shows power consumption when the semiconductor laser element was operated at high temperature.

Herein evaluation was performed by varying thermistor temperature of the module in order to vary temperature of the semiconductor laser element. As a result, although, in case where thermistor temperature was 25° C., power consumption of the semiconductor laser module was approximately 8 W, the power consumption can be reduced to 6.2 W by driving the semiconductor laser element at 40° C. In addition, in the semiconductor laser module using the element according to the embodiment 1, power consumption is reduced by approximately 2.7 W relative to the semiconductor laser module using the comparison element.

This is because load to the temperature-control module 50 which is an electronic cooler was reduced by increasing temperature of the thermistor, and power consumption of the temperature-control module 50 decreased.

Therefore, by using the semiconductor laser element according to the present embodiment 1 for the semiconductor laser module, the semiconductor laser element can be driven at approximately 40° C. of high temperature, and optical output of 500 mW at the fiber end can be obtained by being driven at approximately 6 to 8 W of low power consumption. As a result, there is an effect that power consumption of the optical fiber amplifier can be reduced by using this semiconductor laser module for the optical fiber amplifier.

As explained above, the semiconductor laser module according to the embodiment 3 uses the semiconductor laser element according to the embodiment 1 for the semiconductor laser element 52. Since the semiconductor laser element 52 has a feature of being operable with low power consumption and high power output and being capable of coupling with the optical fiber via the optical component with high coupling efficiency, a semiconductor laser module with low power consumption and high power output can be realized. Furthermore, since the semiconductor laser element 52 has a feature of high photoelectric conversion efficiency, the semiconductor laser element 52 can be operated at high temperature, and thus load to the temperature-control module 50 is reduced, a semiconductor laser module with lower power consumption and high power output can be realized.

It should be noted that, although the 2-lens system is employed in the present embodiment, a semiconductor laser module of a 1 lens system may be configured by components such as the semiconductor laser element according to the embodiment of the present invention, a focusing lens, an isolator, and an optical fiber etc. Also, a semiconductor laser module can be configured by the semiconductor laser element according to the embodiments of the present invention and a lensed fiber. In particular, in a semiconductor laser module having a fiber grating which is an optical fiber having a grating provided to a part thereof, there is an effect that laser oscillation wavelength is stabilized at a wavelength selected by the fiber grating.

It should be noted that a butterfly package is used in the present embodiment 3, a semiconductor laser module using a Can type package may be configured.

It should be noted that, as described above, in the modification example of the present embodiment 3, when the FBG of which reflectivity is 1.8%, reflection band width (full width at half maximum) is 1.8 nm, and central wavelength is 1425 nm was used, the power consumption when optical output at the fiber end was 500 mW was 8 W. In contrast to this, when using an FBG of which reflectivity is 3.5% and other characteristics are the same as those of the above description, the power consumption when optical output at the fiber end was 500 mW was 8.5 W.

It should be noted that, a Raman amplifier has a problem that, if spectral line width of a pumping light source is narrow, sufficient Raman gain cannot be obtained because of influence of stimulated Brillouin scattering which is non-linear effect in an optical fiber.

As a countermeasure to this, it is effective to include a great number of Fabry-Perot modes within reflection band width equal to or greater than 1 nm of an FBG in spectrum of laser light. For that purpose, it is effective to make a cavity of a semiconductor laser element longer or extend the reflection band width of the FBG.

For example, in the present modification example, the laser element of which cavity length is 2 mm includes 12 longitudinal modes of which interval is approximately 0.15 nm within reflection band width. Furthermore, by setting the cavity length at 3 mm, longitudinal mode interval becomes 0.1 nm, thus it is possible to include 18 longitudinal modes, which is 1.5 times the above described case, within the reflection band width of the FBG.

As other methods, a module configuration, in which 2 FBGs of which wavelengths are substantially the same are disposed at an interval of 80 cm to 100 cm for collapsing coherence of laser light, is effective for restraining influence of stimulated Brillouin scattering. In this state, the FBG closer to the laser element is disposed so that distance from the laser chip is equal to or greater than 80 cm.

It was confirmed that, in a semiconductor laser module using the element of according to the embodiment 1 (4.3 μm of active layer width) manufactured with this configuration, there is not influence of stimulated Brillouin scattering when optical output is equal to or greater than 50 mW.

Furthermore, in the above described method, a problem occurs in an aspect of cost because 2 FBGs are used. For the purpose of reducing cost, in order to collapse coherence of laser light with one FBG and restrain influence of stimulated Brillouin scattering, it is effective to equalize reflectivity of the laser end surface and reflectivity of the FBG substantially.

In a semiconductor laser module using the element (active layer width is 4.3 μm, reflectivity at laser output end surface is 1%) of the embodiment 1 manufactured with this configuration, it is confirmed that influence of stimulated Brillouin scattering is restrained when optical output was equal to or greater than 100 mW and FBG reflectivity is 1.8%±0.36%, or when optical output was equal to or greater than 50 mW and FBG reflectivity is 1.0%±0.2%. It should be noted that, for compatibly achieving higher power output and restraining influence of stimulated Brillouin scattering, it is preferable that reflectivity at laser output end surface is 1% and FBG reflectivity is 1.0%±0.2%.

It should be noted that, since a pumping light source for use of Raman amplifier is usually used by multiplexing wavelengths of laser light from a plurality of pumping light sources, it is preferable to set reflecting band of an FBG at equal to or lower than 2 nm in consideration of loss of optical multiplexer when multiplexing wavelengths.

An optical fiber amplifier according to an embodiment 4 of the present invention will be explained. The embodiment 4 is characterized in that the semiconductor laser module of the above described embodiment 3 is applied to a Raman amplifier.

Figure 16:
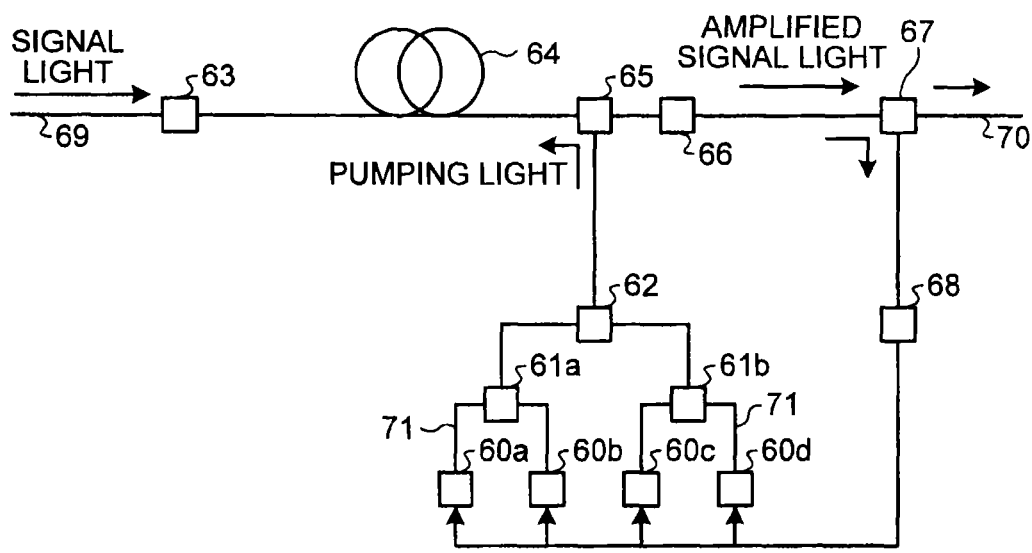
FIG. 16 is a block diagram showing a configuration of an optical fiber amplifier according to an embodiment 4.

FIG. 16 is a block diagram showing a configuration of an optical fiber amplifier which is a Raman amplifier according to the embodiment 4. This Raman amplifier is used for a WDM communication system. In FIG. 16, the Raman amplifier according to the embodiment 4 is configured to use semiconductor laser modules 60a to 60d of which configurations are the same as the semiconductor laser module shown in the above described embodiment 3. It should be noted that, as a semiconductor laser element to be used for the semiconductor laser module, those shown in the embodiments 1, 2-1, and 2-2 can be used.

Each of the semiconductor laser modules 60a and 60b outputs laser light having a plurality of oscillation longitudinal modes to a polarization combining coupler 61a via a polarization —maintaining optical fiber 71, and each of the semiconductor laser modules 60c and 60d outputs laser light having a plurality of oscillation longitudinal modes to a polarization combining coupler 61b via the polarization-maintaining optical fiber 71. Herein wavelengths of the laser light at which the semiconductor laser modules 60a and 60b oscillate are the same. In addition, although wavelengths of the laser light at which the semiconductor laser modules 60c and 60d oscillate are the same, but are different from the wavelengths of the laser light at which the semiconductor laser modules 60a and 60b oscillate. Since Raman amplification has dependence on polarization, it is configured so that laser light of which dependence on polarization is canceled by the polarization combining couplers 61a and 61b is outputted.

Laser light outputted by each of the polarization combining couplers 61a and 61b and having different wavelengths are multiplexed by the WDM coupler 62. The multiplexed laser light is outputted as pumping light for Raman amplification to an amplification optical fiber 64 via the WDM coupler 65. Signal light to be amplified is inputted to the amplification optical fiber 64, into which the pumping light is inputted, and Raman amplification is performed.

The signal light (amplification signal light) having performed Raman amplification in the amplification fiber 64 is inputted to a monitor-light-distributing coupler 67 via the WDM coupler 65 and an optical isolator 66. The monitor-light-distributing coupler 67 outputs a part of the amplification signal light to a control circuit 68 and outputs the rest of the amplification signal light to the signal-light-outputting optical fiber 70 as output laser light.

The control circuit 68 controls laser-outputting state, for example, optical power of each of the semiconductor laser modules 60a to 60d based on the inputted part of the amplification signal light and performs feedback control so that characteristics of a gain band of Raman amplification becomes flat.

As described above, since the optical fiber amplifier according to the present embodiment 4 configures a Raman amplifier by using the semiconductor laser module 60a in which the semiconductor laser element according to the embodiment 1, 2-1, or 2-2 is built in, power of laser light outputted from the semiconductor laser module can be enhanced.

Figure 17:
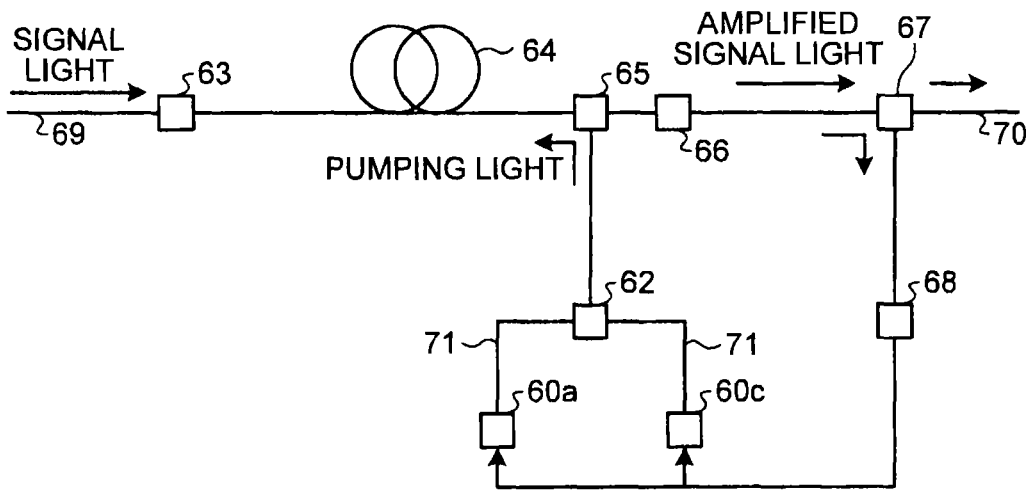
FIG. 17 is a block diagram showing a modification example 1 of the optical fiber amplifier according to the embodiment 4.

FIG. 17 is a block diagram showing a modification example 1 of the optical fiber amplifier according to the embodiment 4. Although the polarization combining couplers 61a and 61b are used in the Raman amplifier shown in FIG. 16, light may be outputted to the WDM coupler 62 directly from the semiconductor laser modules 60a and 60c through the polarization-maintaining fiber 71 respectively. In this case, polarization planes of the laser light outputted from the semiconductor laser modules 60a and 60c are incident at an angle of 45 degrees relative to the optical axis of the polarization-maintaining optical fiber 71.

In addition, the Raman amplifier shown in FIGS. 16 and 17 is of a backward pumping type, Raman amplification can be performed stably even if it is of forward pumping type or bi-directional pumping type.

Figure 18:
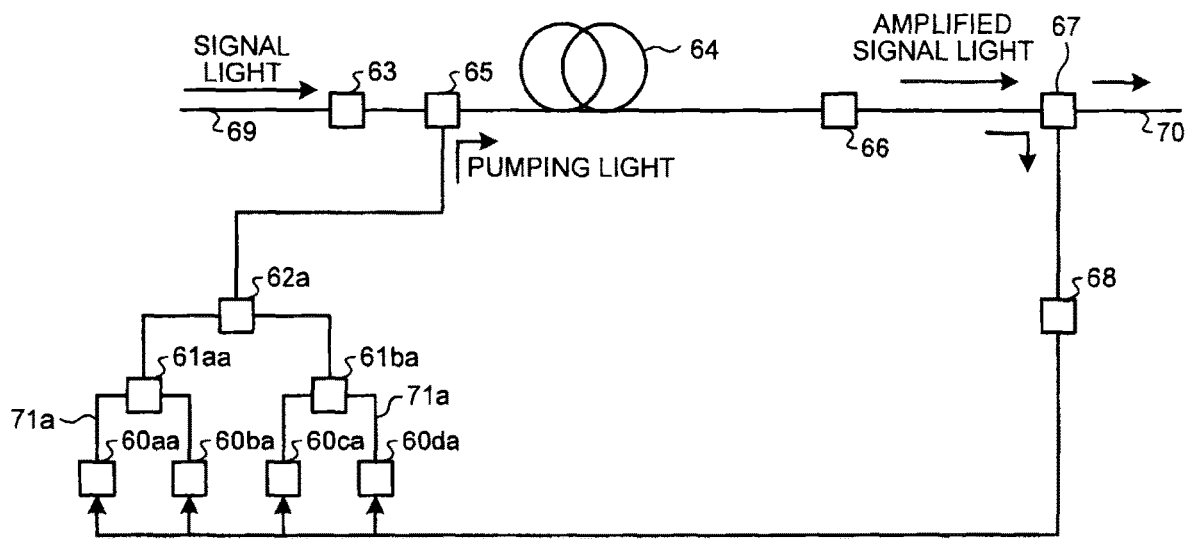
FIG. 18 is a block diagram showing a configuration of a modification example 2 of the optical fiber amplifier according to the embodiment 4, which adopts forward pumping method.

For example, FIG. 18 is a block diagram showing a configuration of a modification example 2 of the optical fiber amplifier according to the embodiment 4, which is a Raman amplifier adopting forward pumping type. The Raman amplifier shown in FIG. 18 has a WDM coupler 65a, in place of the WDM coupler 65 in the Raman amplifier shown in FIG. 16, in the vicinity of the optical isolator 63. A circuit having semiconductor laser modules 60aa to 60da, polarization combining couplers 61aa and 61ba, and a WDM coupler 62a corresponding respectively to the semiconductor laser modules 60a to 60d, the polarization combining couplers 61a and 61b, and the WDM coupler 62 is connected to this WDM coupler 65a, and forward pumping is performed in which pumping light outputted from the WDM coupler 62a is outputted in the direction same as that of the signal light.

Figure 19:
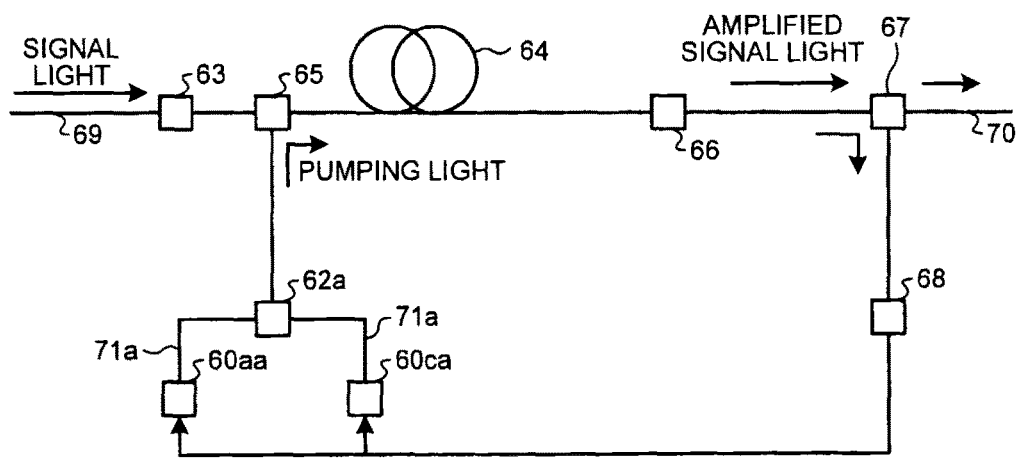
FIG. 19 is a block diagram showing a modification example 3 of the optical fiber amplifier according to the embodiment 4.

Similarly, FIG. 19 is a block diagram showing a configuration of a modification example 3 of the optical fiber amplifier according to the embodiment 4 which is a Raman amplifier adopting forward pumping type. The Raman amplifier shown in FIG. 19 has the WDM coupler 65a, in place of the WDM coupler 65 in the Raman amplifier shown in FIG. 17, in the vicinity of the optical isolator 63. A circuit having the semiconductor laser modules 60aa and 60c' and the WDM coupler 62a corresponding respectively to the semiconductor laser modules 60a and 60c and the WDM coupler 62 is connected to this WDM coupler 65a, and forward pumping is performed in which pumping light outputted from the WDM coupler 62a is outputted in the direction same as that of the signal light.

Figure 20:
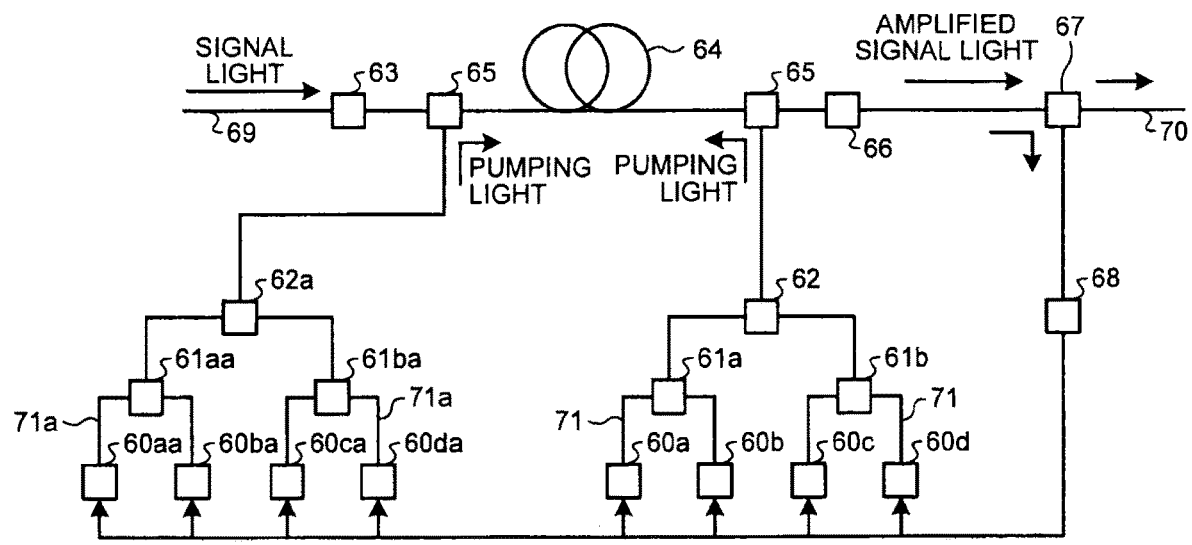
FIG. 20 is a block diagram showing a configuration of a modification example 4 of the optical fiber amplifier according to the embodiment 4, which adopts bi-directional pumping method.

Also, FIG. 20 is a block diagram showing a configuration of a modification example 4 of the optical fiber amplifier according to the embodiment 4, which is a Raman amplifier adopting bi-directional pumping type. The Raman amplifier shown in FIG. 20 is provided with the WDM coupler 65a, the semiconductor laser modules 60aa to 60da, the polarization combining coupler 61aa and 61ba, and the WDM coupler 62a shown in FIG. 18 in addition to the configuration of the Raman amplifier shown in FIG. 16, and is of bi-directional pumping type in which backward pumping and forward pumping are performed.

Figure 21:
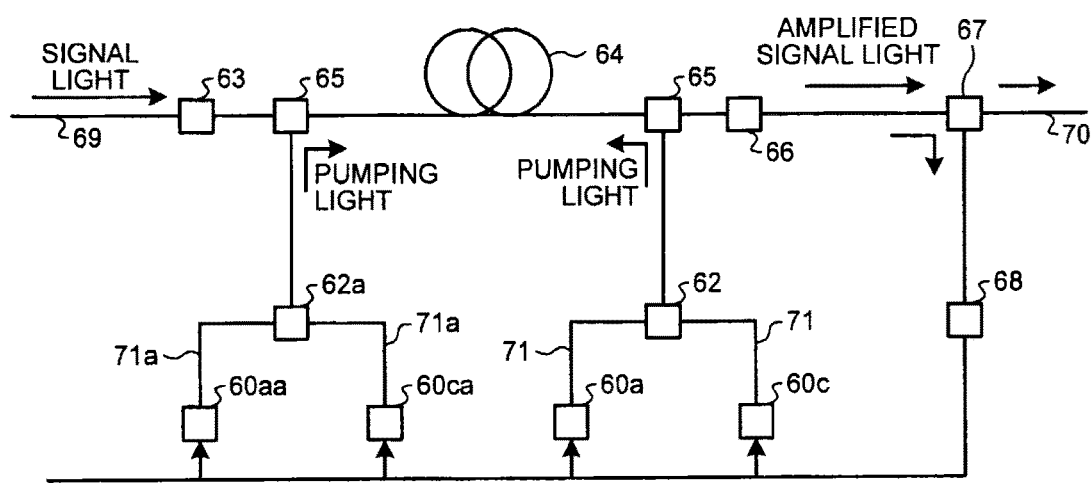
FIG. 21 is a block diagram showing a modification example 5 of the optical fiber amplifier according to the embodiment 4.

Similarly, FIG. 21 is a block diagram showing a configuration of a modification example 5 of the optical fiber amplifier according to the embodiment 4 which is a Raman amplifier adopting bi-directional pumping type.

The Raman amplifier shown in FIG. 21 is provided with the WDM coupler 65a, the semiconductor laser modules 60aa and 60ca, and the WDM coupler 62a shown in FIG. 19 in addition to the configuration of the Raman amplifier shown in FIG. 17, and is of bi-directional pumping type in which backward pumping and forward pumping are performed.

Figure 22:
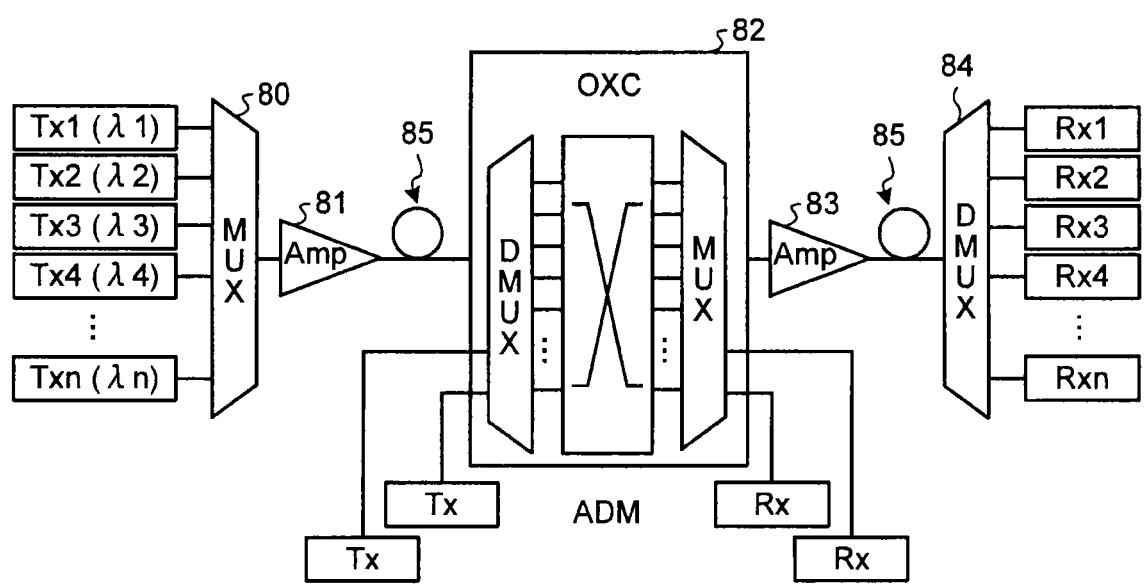
FIG. 22 is a block diagram showing a schematic configuration of a WDM communication system using the optical fiber amplifier according to the embodiment 4 or a modification example thereof.

The above described Raman amplifier shown in FIGS. 16 to 21 can be applied to a WDM communication system. FIG. 22 is a block diagram showing a schematic configuration of a WDM communication system to which the optical fiber amplifier is applied which is a Raman amplifier according to the embodiment 4 or the modification example thereof.

In FIG. 22, optical signals, of which wavelengths are $\lambda 1$ to $\lambda n$, transmitted from a plurality of transmitters Tx1 to Txn are multiplexed by an optical multiplexer 80 and coupled to an optical fiber 85. A plurality of Raman amplifiers 81, 83 corresponding to the Raman amplifier shown in FIGS. 16 to 21 are disposed on a transmission path of the optical fiber 85 according to transmission distance and amplifies the optical signal which is attenuated. The optical signal transmitted on the optical fiber 85 is demultiplexed by an optical demultiplexer 84 into a plurality of optical signals of which wavelengths are $\lambda 1$ to $\lambda n$, and are received by a plurality of receivers Rx1 to Rxn. It should be noted that there is a case where an add/drop multiplexer (ADM) which adds and extracts an arbitrary wavelength of optical signal is inserted on the optical fiber 85.

It should be noted that, although the above described embodiment 4 is a case where the semiconductor laser element according to the embodiments 1, 2-1, and 2-2 or the semiconductor laser module according to the embodiment 3 is used for a pumping light source for use in Raman amplification, the present invention is not limited to this. It is obvious that, for example, an optical fiber amplifier which is an EDFA can be realized by using as a pumping light source for EDFA such as 980 nm or 1480 nm and by using an optical fiber including erbium which is an amplification medium as an amplification optical fiber.

The semiconductor laser element according to the embodiments of the present invention can achieve highly improved efficiency by reducing internal loss by reducing inter valence band absorption. Reduction in electric resistance and reduction in thermal resistance are possible by reducing layer thickness of the p-type cladding layer by reducing internal loss. Also, as compared with a semiconductor laser element not including an electric-field-distribution-control layer, since the length of a cavity for achieving the same efficiency can be longer, reduction in electric resistance and reduction of thermal resistance are possible. By these effects, driving current and driving voltage for obtaining desirable optical output are reduced, low power consumption is possible.

Also, since current can be injected to the active layer efficiently by applying the semiconductor laser element according to the embodiments of the present invention to a semiconductor laser element of a current-confining structure, a semiconductor laser which is operated with low threshold current can be realized. Furthermore, since refractive index difference between a current-confining region and an active layer region can be reduced by interposing an electric-field-distribution-control layer in the current-confining region, a semiconductor laser element which is operable by a single transverse mode, even if the active layer width is broadened, can be realized. Since electric resistance and thermal resistance can be reduced by this, a high power outputting and low power consuming semiconductor laser element can be realized in which thermal saturation hardly occurs. Also, since a semiconductor laser element outputting laser light which is approximately round beam can be realized by a combination with a buried hetero structure as the current-confining structure, a semiconductor laser module which can be coupled with an optical fiber with high efficiency via an optical component such as a lens can be realized.

In addition, the semiconductor laser element according to the embodiments of the present invention does not deteriorate current-injecting efficiency to the active layer. Therefore, since increase in voltage, increase in threshold, decrease in efficiency due to increase in resistance when introducing the electric-field-distribution-control layer can be restrained, a highly efficient and low-power-consuming semiconductor laser element can be realized.

In addition, since the semiconductor laser element according to the embodiments of the present invention can realize a low-power-consuming highly efficient GaInAsP-based semiconductor laser element, higher performance and lower power consumption for a large-capacity communication system can be realized.

In addition, since sum of the layer thicknesses of GaInAsP layers constituting an electric-field-distribution-control layer is thinner than 1 μm according to the semiconductor laser element according to the embodiments of the present invention, a manufacturing process can be realized in which there is fewer crystal defect or surface defect. By doing this, a low-power-consuming, high-power-outputting and highly reliable GaInAsP-based semiconductor laser can be realized at low cost. In addition, in a semiconductor laser element using an electric-field-distribution-control layer constituted by InP and GaInAsP, ratio including GaInAsP is smaller than a semiconductor laser to which a GaInAsP cladding layer is applied. Therefore, since thermal resistance can be reduced in a laser module assembled with junction up, for example, a ridge-waveguide-type laser module or a module using an integrated optical element, a wavelength-variable laser which is superior in operation at high temperature can be realized.

In addition, according to the semiconductor laser element according to the embodiments of the present invention, since band gap composition wavelength of the GaInAsP layer constituting the electric-field-distribution-control layer is equal to or greater than 1 μm, a manufacturing process can be realized in which composition control for Ga and As is easy. Therefore, a low-power-consuming, high-power-outputting and highly reliable GaInAsP-based semiconductor laser can be realized at low cost.

In addition, since the semiconductor laser module according to the embodiments of the present invention uses the above described semiconductor laser element, there is an effect that a semiconductor laser module which is operable with low power consumption and high power output can be provided.

In addition, according to the optical fiber amplifier according to the embodiments of the present invention, there is an effect that an optical fiber amplifier with stable amplification gain and high gain can be provided by using the above described semiconductor laser element or the semiconductor laser module.

Also, further effect and variation can be easily derived by those skilled in the art. Therefore, broader aspects of the present invention are not intended to be limited to the above described embodiments, and various changes are possible.

As described above, the semiconductor device, the semiconductor laser module, and the optical fiber amplifier according to the present invention are preferable to be used mainly for optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical semiconductor device outputting a predetermined wavelength of laser light comprising:
   a quantum well active layer positioned between a p-type cladding layer and an n-type cladding layer in thickness direction;
   a separate confinement heterostructure layer positioned between the quantum well active layer and the n-type cladding layer; and
   an electric-field-distribution-control layer positioned between the separate confinement heterostructure layer and the n-type cladding layer and configured by at least two semiconductor layers having band gap energy greater than band gap energy of a barrier layer constituting the quantum well active layer,
   wherein the quantum well active layer is doped with 0.3 to $1 \times 10^{18}/cm^3$ of n-type impurity.

2. The optical semiconductor device according to claim 1, further comprising a current constriction structure positioned at both sides of width direction of the quantum well active layer, wherein
   the electric-field-distribution-control layer is formed to overlap with the current constriction structure in the thickness direction.

3. The optical semiconductor device according to claim 1, wherein
   the semiconductor layers constituting the electric-field-distribution-control layer are constituted by a first semiconductor layer made from semiconductor material having band gap energy that is the same as the n-type cladding layer and a second semiconductor layer made from semiconductor material having band gap energy greater than the barrier layer constituting the quantum well active layer.

4. The optical semiconductor device according to claim 3, wherein
   the first semiconductor layer is made from InP, and
   the second semiconductor layer is made from III-V group compound semiconductor including an As atom and a P atom as composition.

5. The optical semiconductor device according to claim 4, wherein
   the second semiconductor layer is made from GaInAsP, and
   a sum of layer thicknesses of the second semiconductor layers constituting the electric-field-distribution-control layer is equal to or smaller than 1 μm.

6. The optical semiconductor device according to claim 5, wherein band gap composition wavelength of GaInAsP constituting the second semiconductor layer is equal to or greater than 1 μm.

7. A semiconductor laser module comprising:
   an optical semiconductor device which is a semiconductor laser element outputting a predetermined wavelength of laser light comprising:

a quantum well active layer positioned between a p-type cladding layer and an n-type cladding layer in thickness direction;

a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer;

a temperature-control module controlling temperature of the semiconductor laser element; an optical fiber guiding the laser light outputted from the semiconductor laser element to outside; and an optical-coupling lens system coupling the semiconductor laser element and the optical fiber optically.

8. The semiconductor laser module according to claim 7, further comprising:

an optical detector measuring optical output from the semiconductor laser element; and an optical isolator transmitting therethrough the laser light outputted from the semiconductor laser element.

9. The semiconductor laser module according to claim 7, further comprising:

an optical detector measuring optical output from the semiconductor laser element; and an optical feedback unit returning a part of the laser light propagating the optical fiber to the semiconductor laser element.

10. The semiconductor laser module according to claim 7, wherein the optical-coupling lens system is a lensed fiber.

11. An optical fiber amplifier comprising:

a semiconductor laser module comprising:

an optical semiconductor device which is a semiconductor laser element outputting a predetermined wavelength of laser light comprising:

a quantum well active layer positioned between a p-type cladding layer and an n-type cladding layer in thickness direction;

a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer;

a temperature-control module controlling temperature of the semiconductor laser element;

an optical fiber guiding the laser light outputted from the semiconductor laser element to outside; and an optical-coupling lens system coupling the semiconductor laser element and the optical fiber optically;

an amplification optical fiber including amplification medium; and an optical coupler multiplexing inputted signal light and the laser light outputted from the semiconductor laser module and making the multiplexed light input into the amplification optical fiber.

12. An optical fiber amplifier comprising:

a semiconductor laser module comprising:

an optical semiconductor device which is a semiconductor laser element outputting a predetermined wavelength of laser light comprising:

a quantum well active layer positioned between a p-type cladding layer and an n-type cladding layer in thickness direction;

a separate confinement heterostructure layer positioned between the quantum well active layer and the n-type cladding layer; and an electric-field-distribution-control layer positioned between the separate confinement heterostructure layer and the n-type cladding layer and configured by at least two semiconductor layers having band gap energy greater than band gap energy of a barrier layer constituting the quantum well active layer;

a temperature-control module controlling temperature of the semiconductor laser element;

an optical fiber guiding the laser light outputted from the semiconductor laser element to outside; and an optical-coupling lens system coupling the semiconductor laser element and the optical fiber optically;

an optical fiber transmitting signal light; and an optical coupler making the laser light outputted from the semiconductor laser module input into the optical fiber, wherein an optical amplification is performed by Raman amplification.

* * * * *